(12) United States Patent
Hao et al.

(10) Patent No.: US 12,347,352 B2
(45) Date of Patent: Jul. 1, 2025

(54) DRIVER CHIP, LIGHT-EMITTING SUBSTRATE AND TESTING METHOD THEREOF, AND DISPLAY APPARATUS

(71) Applicants: BOE MLED Technology Co., Ltd., Beijing (CN); BOE TECHNOLOGY GROUP CO., LTD., Beijing (CN)

(72) Inventors: Wei Hao, Beijing (CN); Junwei Zhang, Beijing (CN); Xiaoyu Zhang, Beijing (CN); Lingyun Shi, Beijing (CN)

(73) Assignees: BOE MLED Technology Co., Ltd., Beijing (CN); ROE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 18/263,378

(22) PCT Filed: Jul. 14, 2022

(86) PCT No.: PCT/CN2022/105751
§ 371 (c)(1),
(2) Date: Jul. 28, 2023

(87) PCT Pub. No.: WO2024/011508
PCT Pub. Date: Jan. 18, 2024

(65) Prior Publication Data
US 2024/0428711 A1 Dec. 26, 2024

(51) Int. Cl.
*G09G 3/36* (2006.01)
*G02F 1/133* (2006.01)
(Continued)

(52) U.S. Cl.
CPC ......... *G09G 3/006* (2013.01); *G02F 1/13306* (2013.01); *G09G 3/32* (2013.01);
(Continued)

(58) Field of Classification Search
None
See application file for complete search history.

(56) References Cited

U.S. PATENT DOCUMENTS

| 6,611,635 B1 | 8/2003 | Yoshimura et al. |
| 2011/0018888 A1 | 1/2011 | Yang et al. |

(Continued)

FOREIGN PATENT DOCUMENTS

| AU | 2009100207 A4 | 4/2009 |
| CN | 201057388 Y | 5/2008 |

(Continued)

OTHER PUBLICATIONS

PCT International Search Report (w/ English translation) and Written Opinion for corresponding PCT Application No. PCT/CN2022/105751, dated Dec. 29, 2022, 11 pages.

*Primary Examiner* — Roy P Rabindranath
(74) *Attorney, Agent, or Firm* — Dority & Manning, P.A.

(57) ABSTRACT

A driver chip is disclosed. The driver chip includes: a logic control module, at least one output pin and a first functional pin. The at least one output pin is electrically connected to the logic control module, and the first functional pin is electrically connected to the logic control module. The first functional pin is capable of receiving a test signal, and the logic control module is configured to generate, according to the test signal, a test current flowing through each output pin.

20 Claims, 17 Drawing Sheets

(51) Int. Cl.
  *G09G 3/00* (2006.01)
  *G09G 3/32* (2016.01)
  *H01L 25/16* (2023.01)

(52) U.S. Cl.
  CPC .............. *G09G 2310/0272* (2013.01); *G09G 2330/021* (2013.01); *G09G 2330/12* (2013.01); *H01L 25/167* (2013.01)

(56) References Cited

U.S. PATENT DOCUMENTS

| | | | |
|---|---|---|---|
| 2017/0059897 A1* | 3/2017 | Xu | .......................... G09G 3/36 |
| 2024/0027834 A1 | 1/2024 | Liu et al. | |
| 2024/0030273 A1 | 1/2024 | Cui et al. | |
| 2024/0038946 A1 | 2/2024 | Zhao et al. | |

FOREIGN PATENT DOCUMENTS

| | | | |
|---|---|---|---|
| CN | 101340757 A | | 1/2009 |
| CN | 201570232 U | | 9/2010 |
| CN | 112654119 | * | 4/2013 |
| CN | 202907302 U | | 4/2013 |
| CN | 106952608 A | | 7/2017 |
| CN | 110070827 A | | 7/2019 |
| CN | 112309884 A | | 2/2021 |
| CN | 112654119 A | | 4/2021 |
| CN | 113851080 A | | 12/2021 |
| CN | 114171546 A | | 3/2022 |
| JP | 2004172684 A | | 6/2004 |
| WO | WO2021202015 A1 | | 10/2021 |

* cited by examiner

DRIVER CHIP, LIGHT-EMITTING SUBSTRATE AND TESTING METHOD THEREOF, AND DISPLAY APPARATUS

CROSS-REFERENCE TO RELATED APPLICATION

This application is a national phase entry under 35 USC 371 of International Patent Application No. PCT/CN2022/105751, filed on Jul. 14, 2022, which is incorporated herein by reference in its entirety.

TECHNICAL FIELD

The present disclosure relates to the field of display technologies, and in particular, to a driver chip, a light-emitting substrate and a testing method thereof, and a display apparatus.

BACKGROUND

A display apparatus can be used to display images. With the rapid development of display technologies, display apparatuses have gradually come throughout people's lives.

SUMMARY

In an aspect, a driver chip is provided. The driver chip includes: a logic control module, at least one output pin and a first functional pin. The at least one output pin is electrically connected to the logic control module, and the first functional pin is electrically connected to the logic control module, wherein the first functional pin is capable of receiving a test signal, and the logic control module is configured to generate, according to the test signal, a test current flowing through each output pin.

In some embodiments, the test signal includes a switch signal, and the switch signal is used to control the logic control module to generate the test current flowing through each output pin.

In some embodiments, the driver chip further includes an address pin and a relay pin. The address pin is electrically connected to the logic control module, and the address pin is capable of receiving driving data; the driving data includes address verification information and a plurality of pieces of driving information corresponding to a plurality of driver chips that are cascaded. The logic control module is further configured to: obtain, according to the address verification information, a piece of driving information corresponding to the driver chip; update the address verification information, and generate driving data including updated address verification information. The relay pin is electrically connected to the logic control module, and the relay pin is capable of outputting the driving data including the updated address verification information.

In some embodiments, the test signal includes test data and general address information, and the general address information is capable of matching address information of any one driver chip. The logic control module is configured to generate, according to the test data, the test current flowing through each output pin.

In some embodiments, the driver chip further includes an address pin and a relay pin. The address pin is electrically connected to the logic control module, the address pin is capable of receiving an address signal, and the logic control module is further configured to configure address information of the driver chip according to the address signal and generate a relay signal. The relay pin is electrically connected to the logic control module, and the relay pin is capable of outputting the relay signal. The first functional pin is further capable of receiving driving data, and the driving data includes a plurality of pieces of address verification information and a plurality of pieces of driving information corresponding to the plurality of pieces of address verification information. The logic control module is further configured to: when a piece of address verification information in the plurality of pieces of address verification information matches the address information of the driver chip, receive a corresponding piece of driving information according to the piece of address verification information, and generate a driving current corresponding to the at least one output pin according to the received driving information.

In some embodiments, the driver chip further includes a second functional pin and a first connection line, the second functional pin is connected to the first functional pin through the first connection line; the second functional pin is capable of outputting the test signal. The driver chip has a first edge and a second edge that are parallel to each other. One of the first functional pin and the second functional pin is close to the first edge, and another one thereof is close to the second edge.

In some embodiments, the driver chip further has a third edge located between a first end of the first edge and a first end of the second edge. In a case where the driver chip further includes the address pin and the relay pin, one of the address pin and the relay pin is close to the first edge, and another one thereof is close to the second edge. The address pin and the relay pin are both closer to the third edge than the first functional pin and the second functional pin.

In some embodiments, the driver chip further includes at least one ground pin electrically connected to the logic control module, a ground pin in the at least one ground pin is capable of receiving a ground signal, and the ground pin is located between the address pin and the relay pin.

In some embodiments, the driver chip further includes a first power supply pin electrically connected to the logic control module, wherein the first power supply pin is capable of receiving a power supply signal, and the first power supply pin is close to the first edge or the second edge.

In some embodiments, the driver chip further includes a second power supply pin and a second connection line, the second power supply pin being connected to the first power supply pin through the second connection line, and the second power supply pin being capable of outputting the power supply signal. One of the first power supply pin and the second power supply pin is close to the first edge, and another one thereof is close to the second edge. The first power supply pin and the second power supply pin are both farther away from the third edge than the address pin and the relay pin.

In some embodiments, the driver chip further has a fourth edge located between a second end of the first edge and a second end of the second edge. The at least one output pin includes a plurality of output pins, the plurality of output pins are close to the fourth edge, and the plurality of output pins are arranged along an extending direction of the fourth edge.

In another aspect, a light-emitting substrate is provided. The light-emitting substrate includes a plurality of driver chips that are cascaded and a plurality of device groups. Each driver chip is the driver chip as described in any of the embodiments above. At least one output pin of the driver chip is electrically connected to at least one first terminal of a device group, respectively.

In some embodiments, in a case where the driver chip further includes: the address pin, the relay pin, the first power supply pin and the at least one ground pin, a relay pin of a former-stage driver chip in the plurality of driver chips is electrically connected to an address pin of a latter-stage driver chip in the plurality of driver chips. The light-emitting substrate further includes a conductive layer, the conductive layer includes: a second voltage line, an address signal line, a first voltage line, a test signal line and a ground line. The second voltage line is electrically connected to second terminals of the device groups. The address signal line is electrically connected to an address pin of a first-stage driver chip in the plurality of driver chips. The first voltage line is electrically connected to a first power supply pin of the first-stage driver chip. The test signal line is electrically connected to a first functional pin of the first-stage driver chip. The ground line is electrically connected to the at least one ground pin of each driver chip. The second voltage line, the address signal line, the first voltage line, the test signal line and the ground line do not overlap with each other.

In some embodiments, in a case where the driver chip further includes the second functional pin, a second functional pin of a current-stage driver chip is electrically connected to a first functional pin of the current-stage driver chip and a first functional pin of a next-stage driver chip in the plurality of driver chips.

In some embodiments, in a case where the driver chip further includes a second power supply pin, a second power supply pin of a current-stage driver chip is electrically connected to a first power supply pin of the current-stage driver chip and a first power supply pin of a next-stage driver chip in the plurality of driver chips.

In some embodiments, the address signal line is configured to transmit an address signal, the test signal line is configured to transmit the test signal and driving data in a time-sharing manner; or the address signal line is configured to transmit the driving data, and the test signal line is configured to transmit the test signal.

In yet another aspect, testing method of a light-emitting substrate is provided. The light-emitting substrate is the light-emitting substrate according to any one of the embodiments above. The testing method includes: inputting a test signal to a first functional pin of each driver chip, so that a logic control module of each driver chip generates, according to the test signal, a test current flowing through each output pin of the driver chip; and determining a light-emitting state of a device group electrically connected to any one driver chip; if the device group emits light normally, determining that the device group and a corresponding driver chip are connected normally; and if the device group does not emit light or emits light abnormally, determining that the device group and the corresponding driver chip are connected abnormally.

In some embodiments, the inputting the test signal to the first functional pin of each driver chip includes: inputting a switch signal to the first functional pin of each driver chip, the switch signal being used to control the logic control module to generate the test current flowing through each output pin.

In some embodiments, the testing method further includes: inputting driving data to an address pin of a first-stage driver chip in the plurality of driver chips that are cascaded, the driving data including address verification information and a plurality of pieces of driving information corresponding to the plurality of driver chips that are cascaded, wherein an address pin of a driver chip in any one stage other than the first stage is electrically connected to a relay pin of a former-stage driver chip; a current-stage driver chip obtains, according to the address verification information, a piece of driving information corresponding to the current-stage driver chip, and generates, according to the piece of driving information, a driving current corresponding to the device group connected to the current-stage driver chip; the current-stage driver chip further updates the address verification information, generates driving data including the updated address verification information, and outputs the driving data including the updated address verification information to an address pin of a next-stage driver chip through a relay pin of the current-stage driver chip; and determining whether there is a device group that does not emit light in device groups connected to the plurality of driver chips that are cascaded; if there is the device group that does not emit light, determining that an abnormality exists in a driver chip connected to a first device group that does not emit light according to a cascaded sequence; and if there is no device group that does not emit light, determining that no abnormality exists in the plurality of driver chips that are cascaded.

In some embodiments, the inputting the test signal to the first functional pin of each driver chip includes: inputting a test signal including test data and first general address information to the first functional pin of each driver chip, the first general address information being capable of matching initialization address information of any one driver chip.

In some embodiments, the testing method further includes: inputting an address signal to an address pin of a first-stage driver chip in the plurality of driver chips that are cascaded, wherein an address pin of a driver chip in any one stage other than the first stage is electrically connected to a relay pin of a former-stage driver chip; a current-stage driver chip configures address information of the current-stage driver chip according to a received address signal, and generates a relay signal; a relay pin of the current-stage driver chip outputs the relay signal to an address pin of a next-stage driver chip; and the relay signal and the received address signal are same. The testing method further includes: inputting a test signal including test data and second general address information to the first functional pin of each driver chip, the second general address information being capable of matching updated address information of any one driver chip, so that the logic control module of each driver chip generates, according to the test signal, a test current flowing through each output pin; and determining whether there is a device group that does not emit light in device groups connected to the plurality of driver chips that are cascaded; if there is the device group that does not emit light, determining that an abnormality exists in a driver chip connected to a first device group that does not emit light according to a cascaded sequence; and if there is no device group that does not emit light, determining that no abnormality exists in the plurality of driver chips that are cascaded.

In some embodiments, the testing method further includes: inputting an address signal to an address pin of a first-stage driver chip in the plurality of driver chips that are cascaded, wherein an address pin of a driver chip in any one stage other than the first stage is electrically connected to a relay pin of a former-stage driver chip; a current-stage driver chip configures address information of the current-stage driver chip according to a received address signal, and generates a relay signal; a relay pin of the current-stage driver chip outputs the relay signal to an address pin of a next-stage driver chip; and the relay signal is different from the received address signal; inputting driving data to the first functional pin of each driver chip in the plurality of driver chips that are cascaded, the driving data including a plurality of pieces of address verification information and a plurality of pieces of driving information corresponding to the plurality of pieces of address verification information, wherein for any one driver chip, when a piece of address verification information in the plurality of pieces of address verification information matches the address information of the driver chip, a logic control module receives a corresponding piece of driving information according to the piece of address verification information, and generates, according to the received driving information, a driving current corresponding to at least one output pin; and determining whether there is a device group that does not emit light in device groups connected to the plurality of driver chips that are cascaded; if there is the device group that does not emit light, determining that an abnormality exists in a driver chip connected to a first device group that does not emit light according to a cascaded sequence; and if there is no device group that does not emit light, determining that no abnormality exists in the plurality of driver chips that are cascaded.

In yet another aspect, a display apparatus is provided. The display apparatus includes the light-emitting substrate according to any one of the embodiments above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these accompanying drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
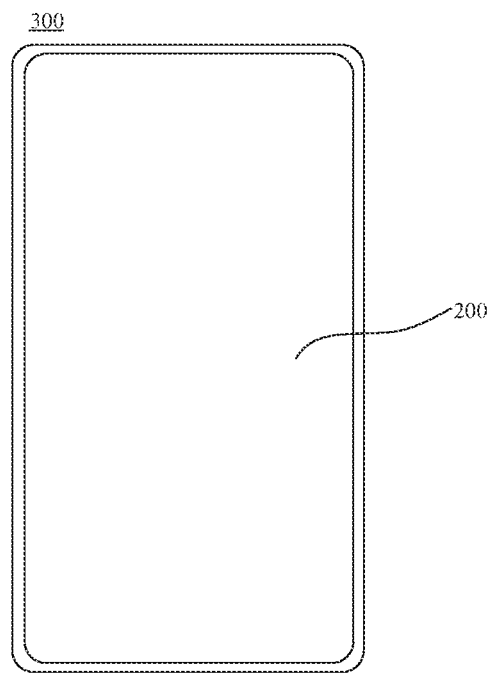
FIG. 1 is a structural diagram of a display apparatus provided in some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "connected" and derivatives thereof may be used. For example, the term "connected" may be used in the description of some embodiments to indicate that two or more components are in direct physical or electrical contact with each other.

The phrase "configured to" used herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or value exceeding those stated.

As used herein, the term such as "parallel" or "perpendicular" includes a stated condition and a condition similar to the stated condition. A range of the similar condition is within an acceptable range of deviation, and the acceptable range of deviation is determined by a person of ordinary skill in the art in view of measurement in question and errors associated with measurement of a particular quantity (i.e., the limitation of the measurement system). For example, the term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°.

It will be understood that, in a case where a layer or component is referred to as being on another layer or a substrate, it may be that the layer or component is directly on the another layer or substrate; or it may be that intermediate layer(s) exist between the layer or component and the another layer or substrate.

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

FIG. 1 is a structural diagram of a display apparatus provided in some embodiments of the present disclosure. Referring to FIG. 1, some embodiments of the present disclosure provide a display apparatus 300. The display apparatus 300 includes a light-emitting substrate 200.

For example, the display apparatus 300 may be a liquid crystal display (LCD) apparatus, a mini light-emitting diode (Mini LED) display apparatus or a micro light-emitting diode (Micro LED) display apparatus.

In the case where the display apparatus 300 is the liquid crystal display apparatus, in some embodiments, the display apparatus 300 includes: a glass cover, a liquid crystal display panel and a backlight assembly. The backlight assembly is used to provide a light source for the liquid crystal display panel. The backlight assembly includes the light-emitting substrate 200, and the light-emitting substrate 200 provides light for the liquid crystal display panel, so that the liquid crystal display panel may display images. In some examples, the backlight assembly of the display apparatus 300 may further include an optical film located on a side of the light-emitting substrate 200 proximate to the liquid crystal display panel. The optical film may include: a reflective sheet, a diffuser plate, a brightness enhancement film (a prism sheet), a diffuser sheet, etc., and the optical film may be used to improve brightness and uniformity of light.

In the case where the display apparatus 300 is the Mini LED display apparatus or the Micro LED display apparatus, in some embodiments, the display apparatus 300 includes the light-emitting substrate 200, and the light-emitting substrate 200 may display images. In some examples, the display apparatus 300 may further include an anti-reflection film layer and a protective cover, and the anti-reflection film layer is located between the light-emitting substrate 200 and the protective cover. The anti-reflection film layer includes a polarizer, and the polarizer may be a circular polarizer. Here, the polarizer may reduce the reflection of external light and prevent the light-emitting substrate 200 from reflecting ambient light to cause glare.

The display apparatus 300 may be any apparatus that can display images whether in motion (e.g., videos) or stationary (e.g., still images), and whether literal or graphical. More specifically, it is anticipated that the embodiments may be implemented in or associated with a variety of electronic devices. The variety of electronic devices include (but not limit to), for example, mobile telephones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, automobile displays (e.g., odometer displays), navigators, cockpit controllers and/or displays, camera view displays (e.g., rear view camera displays in a vehicle), electronic photos, electronic billboards or signages, projectors, architectural structures, packaging and aesthetic structures (e.g., displays for displaying an image of a piece of jewelry).

Figure 2:
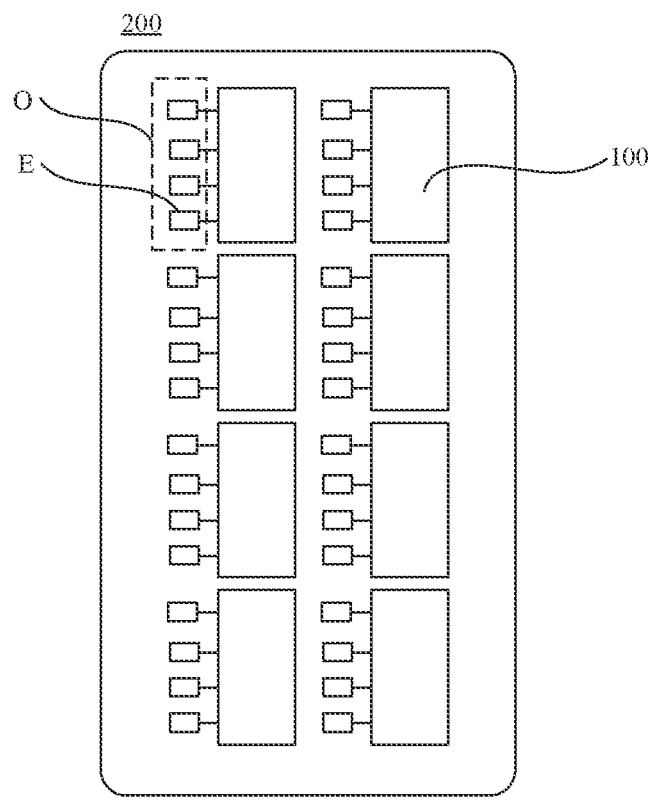
FIG. 2 is a structural diagram of a light-emitting substrate provided in some embodiments of the present disclosure.

FIG. 2 is a structural diagram of the light-emitting substrate provided in some embodiments of the present disclosure.

The light-emitting substrate 200 is provided in some embodiments of the present disclosure. Referring to FIG. 2, the light-emitting substrate 200 includes a plurality of driver chips 100 that are cascaded and a plurality of device groups O that are connected to the driver chips.

In some examples, a device group O includes at least one light-emitting unit E. For example, a light-emitting unit E may include at least one light-emitting element. The light-emitting unit E may include only one light-emitting element; or the light-emitting unit E may include two or more light-emitting elements electrically connected to each other. In the case where the light-emitting unit E includes two or more light-emitting elements, the two or more light-emitting elements may be connected in series or in parallel, or in a combination of series and parallel.

For example, the light-emitting element may be a light-emitting diode (LED), a micro light-emitting diode (Micro LED), a mini light-emitting diode (Mini LED), an organic light-emitting diode (OLED), a quantum dot light-emitting diode (QLED), etc. In the embodiments, the light-emitting unit E may be driven by the driver chip 100 to emit light.

Thus, the light-emitting unit E may be applied to a device such as a display apparatus or a lighting apparatus.

In the case where the display apparatus 300 is the liquid crystal display apparatus, in some examples, the light-emitting substrate 200 is a backlight source of the display apparatus 300 for providing the light source for the liquid crystal display apparatus. Each device group O may be controlled by a driver chip 100, and each light-emitting unit E in the device group O may be independently controlled. In this way, local dimming and high-dynamic range (HDR) images may be achieved by the display apparatus, thereby improving the display quality of the display apparatus 300. The number of light-emitting units E in any one device group O is the same as the number of light-emitting units E in another device group O, and an electrical connection manner of the light-emitting units E in any one device group O is the same as an electrical connection manner of the light-emitting units E in another device group O. The number of light-emitting elements in any one light-emitting unit E is the same as the number of light-emitting elements in another light-emitting unit E, and an electrical connection manner of the light-emitting elements in any one light-emitting unit E is the same as an electrical connection manner of the light-emitting elements in another light-emitting unit E. In this way, the uniformity of distribution of the light-emitting units E in the light-emitting substrate may be ensured, which helps improve the uniformity of light emission of the light-emitting substrate and reduce the difficulty of debugging the backlight assembly.

In the case where the display apparatus is the Mini LED display apparatus or the Micro LED display apparatus, in some examples, the light-emitting units E (e.g., Micro LEDs, Mini LEDs) may emit light to directly display images. For example, the light-emitting units E may be light-emitting elements capable of emitting light of a same color. For example, the light-emitting units E may all be blue LEDs, red LEDs, green LEDs or yellow LEDs. In this way, the display apparatus may be a monochrome display apparatus, which may be a display apparatus such as an instrument dial, or a signal indicating screen. For example, the light-emitting units E may include a plurality of light-emitting elements for emitting light of different colors. For example, the light-emitting units E may include at least two types of LEDs in red LEDs, green LEDs, blue LEDs, yellow LEDs, etc., and light-emitting units E for emitting light of different colors may be independently controlled. In this way, the display apparatus may perform color display by mixing light.

In an implementation of the present disclosure, the plurality of device groups O in the light-emitting substrate 200 are arranged in an array with equal intervals in a row direction and a column direction. For example, the device groups O may be arranged in a plurality of device group rows, and the device group rows are arranged at equal intervals in the column direction; each device group row includes multiple light-emitting units E arranged at equal intervals in the row direction. Light-emitting units E may also be arranged in a plurality of element columns, and the element columns are arranged at equal intervals in the row direction; each element column includes multiple functional elements arranged at equal intervals in the column direction. In this way, it may be possible to improve the uniformity of distribution of the device groups O in the light-emitting substrate 200.

Figure 3:
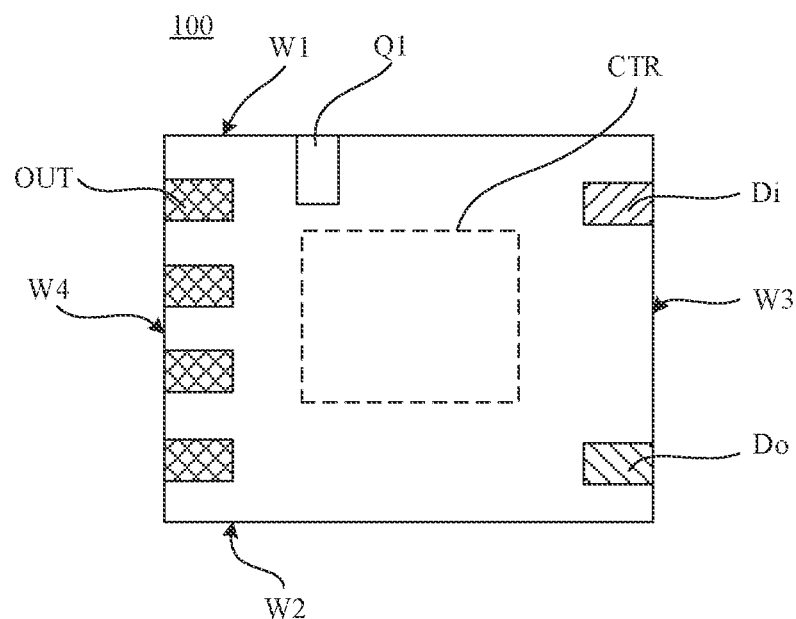
FIG. 3 is a structural diagram of a driver chip provided in some embodiments of the present disclosure.

FIG. 3 is a structural diagram of a driver chip provided in some embodiments of the present disclosure.

The driver chip 100 is provided in some embodiments of the present disclosure. Referring to FIG. 3, the driver chip 100 includes: a logic control module CTR, at least one output pin OUT and a first functional pin Q1.

The at least one output pin OUT is electrically connected to the logic control module CTR. In an implementation of the present disclosure, referring to FIG. 3, FIG. 3 illustrates an example in which the driver chip 100 includes four output pins OUT. Since the driver chip 100 includes four output pins OUT, and each output pin OUT is connected to a light-emitting unit E (as shown in FIG. 2), the driver chip 100 may drive at least four light-emitting units E. The number of driver chips 100 may be reduced to a quarter compared with a scheme in which one driver chip drives one light-emitting unit E. As a result, the number of driver chips 100 is greatly reduced, and thus the cost of the light-emitting substrate 200 is reduced.

It will be noted that, although a volume of the driver chip 100 in the embodiments of the present disclosure is slightly larger than that of a driver chip with only one output pin, the number of driver chips 100 in the light-emitting substrate 200 may be greatly reduced in the embodiments. Thus, it may be possible to reduce an area ratio of all driver chips 100 in the light-emitting substrate 200, and it may also be possible to help improve the bonding efficiency of the driver chips 100 and improve the yield of the light-emitting substrate 200.

For example, the driver chip 100 in the embodiments of the present disclosure has four output pins OUT, and an area of the driver chip 100 is twice that of the driver chip with only one output pin OUT. However, the number of driver chips 100 in the light-emitting substrate 200 in the embodiments may be reduced to a quarter, and thus the area ratio of the driver chips 100 in the light-emitting substrate 200 in the embodiments is reduced to a half (compared with a light-emitting substrate 200 in which one driver chip drives one light-emitting unit E).

It will be understood that, in some other embodiments, the driver chip 100 may include three output pins OUT, five output pins OUT or six output pins OUT.

The first functional pin Q1 is electrically connected to the logic control module CTR. The first functional pin Q1 is capable of receiving a test signal. The logic control module CTR is configured to generate, according to the test signal, a test current flowing through each output pin OUT.

For the driver chip 100 in the embodiments, the first functional pin Q1 may provide the test signal to the logic control module CTR, and the logic control module CTR generates, according to the test signal, the test current flowing through each output pin OUT. The test current may drive a light-emitting unit E electrically connected the driver chip 100 to emit light. By providing the test signal to the first functional pin Q1 of each driver chip 100, a lighting test for light-emitting units E electrically connected to the driver chips 100 may be achieved through one detection operation. If a light-emitting unit E emits light normally, it may be determined that the light-emitting unit E is connected normally; and if the light-emitting unit E does not emit light, it may be determined that the light-emitting unit E has a problem (such as short circuit, open circuit or another defect), and repairing is needed. As a result, the repairing efficiency of the driver chips 100 is improved.

In some examples, the test current flowing through each output pin OUT may be the same. It will be understood that, in some other examples, currents flowing through the output pins OUT may be different. Alternatively, currents flowing through partial output pins OUT are the same. It is not limited in the embodiments of the present disclosure.

Figure 4:
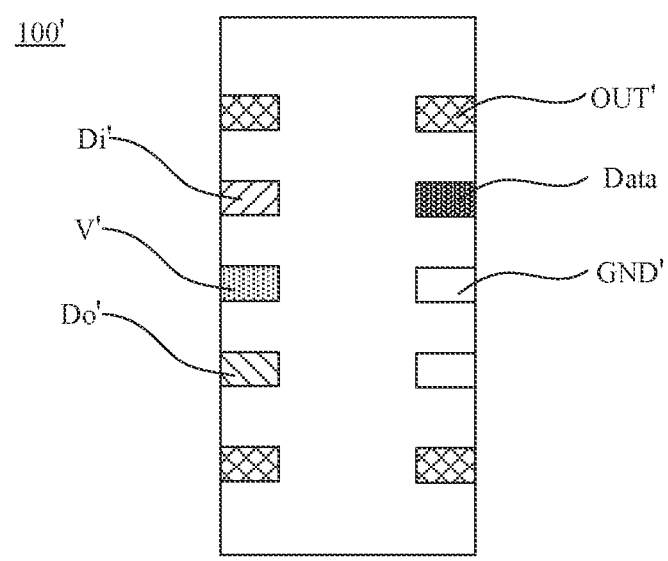
FIG. 4 is a structural diagram of a driver chip in some implementation methods.

FIG. 4 is a structural diagram of a driver chip 100' in some implementations.

It is worth pointing out that, in some implementations, referring to FIG. 4, the driver chip 100' includes: output pins OUT', an address pin Di', a relay pin Do', a data pin Data, ground pins GND' and a power supply pin V'. The address pin Di' is used to receive an address signal. Address information of the driver chip 100' is configured according to the address signal, and a relay signal is generated. The relay signal can serve as an address signal for a next-stage driver chip 100'. The data pin Data is used to receive driving data, and the driving data includes driving information and address verification information. When the address verification information matches the address information, a driving current corresponding to at least one light-emitting unit connected to the driver chip 100' is generated according to the driving information, and an output pin of the driver chip 100' is controlled to form an electrical path with a corresponding light-emitting unit. The driving current flows in the electrical path.

Since the address signal needs to be converted into the relay signal and sent to the next-stage driver chip, in a case where a pin of a certain driver chip is poorly soldered, driver chips in previous stages normally drive light-emitting units, and a light-emitting unit electrically connected to the certain driver chip does not emit light, it may be determined that the light-emitting unit has a problem and needs to be repaired. However, no relay signal can be received by driver chips that are cascaded after the driver chip with the poor soldered pin. That is, the subsequent driver chips cannot provide driving currents, and thus light-emitting units that are connected to the driver chips cannot emit light. As a result, whether the light-emitting units are electrically connected to the driver chips normally cannot be determined. Therefore, the lighting test is required to be continuously repeated to the light-emitting units level by level for judgment, resulting in a low repairing efficiency of the driver chips.

However, the driver chip 100 provided in some embodiments of the present disclosure has the first functional pin Q1 and a second functional pin Q2. The first functional pin Q1 may receive the test signal and send the test signal to the logic control module CTR. The logic control module CTR generates, according to the test signal, the test current flowing through each output pin OUT. The test current may drive a light-emitting unit E to emit light. The second functional pin Q2 is electrically connected to the first functional pin Q1. The second functional pin Q2 is capable of outputting the test signal to a next-stage driver chip 100. Thus, the lighting test for the light-emitting units E electrically connected to the driver chips 100 may be achieved through one detection operation. If a light-emitting unit E does not emit light, it may be determined that the light-emitting unit E has a problem, and it is not required that three stages of writing address, inputting driving data and repairing are repeatedly performed until all light-emitting units are determined whether to be repaired. As a result, the repairing efficiency of the driver chips 100 is effectively improved.

In some embodiments, with continued reference to FIG. 3, the driver chip 100 has a first edge W1 and a second edge W2 that are parallel to each other. The driver chip 100 further has a fourth edge W4 located between a second end of the first edge W1 and a second end of the second edge W2. A plurality of output pins OUT are provided, and the plurality of output pins OUT are close to the fourth edge W4, and the plurality of output pins OUT are arranged along an extending direction of the fourth edge W4.

In the embodiments, the driver chip 100 includes the plurality of output pins OUT, the plurality of output pins OUT are close to the fourth edge, and the plurality of output pins OUT are arranged along the extending direction of the fourth edge W4. As a result, it facilitates the plurality of output pins OUT being electrically connected to a same second voltage line outside the driver chip 100, avoids overlapping between signal lines connected to the driver chip 100, and facilitates a wiring layout of the light-emitting substrate.

For example, FIG. 3 illustrates an example in which an end of the fourth edge W4 is directly connected to the first edge W1 and another end of the fourth edge W4 is directly connected to the second edge W2. It will be understood that, in some other embodiments, the fourth edge W4 and the first edge W1 are connected through another edge. In yet other embodiments, the fourth edge W4 and the second edge W2 are connected through another edge.

Figure 5:
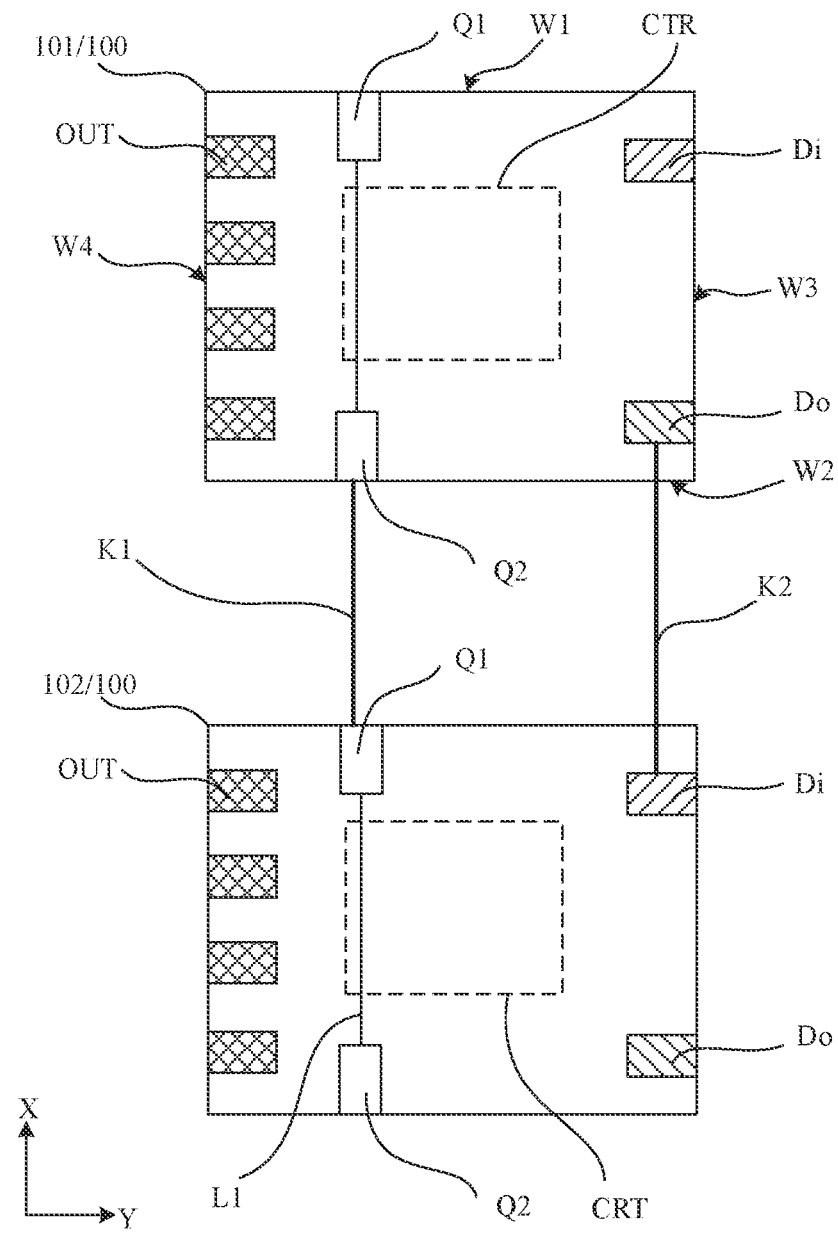
FIG. 5 is a schematic diagram showing two driver chips connected to each other provided in some embodiments of the present disclosure.

FIG. 5 is a schematic diagram showing two driver chips connected to each other provided in some embodiments of the present disclosure.

In some embodiments, referring to FIG. 5, the driver chip 100 further includes the second functional pin Q2. The second functional pin Q2 is electrically connected to the first functional pin Q1. The second functional pin Q2 is capable of outputting the test signal to the next-stage driver chip 100.

With such a structure, the first functional pin Q1 is used to provide the test signal to the logic control module CTR, the logic control module CTR generates, according to the test signal, the test current flowing through each output pin OUT, and the test current may drive the light-emitting unit E to emit light; and the second functional pin Q2 is used to output the test signal to a first functional pin Q1 of the next-stage driver chip 100. Thus, the lighting test for the light-emitting units E electrically connected to the driver chips 100 may be achieved through one detection operation. If a light-emitting unit E emits light normally, it may be determined that the light-emitting unit E is connected normally. If the light-emitting unit E does not emit light, it may be determined that the light-emitting unit E has a problem (such as short circuit, open circuit or another defect), and repairing is needed. As a result, the repairing efficiency of the driver chips 100 is improved.

The second functional pin Q2 is electrically connected to the first functional pin Q1 of the same driver chip 100, and thus the second functional pin Q2 and the first functional pin Q1 receive the same signal. As a result, the test signal may be output to the first functional pin Q1 of the next-stage driver chip 100 through the second functional pin Q2, which facilitates a wiring design for driver chips 100 that are cascaded to each other.

In addition, it may be determined whether the second functional pin Q2 needs to be provided according to the total number of pins of the driver chip 100, so as to ensure that the total number of pins of the driver chip 100 is an even number.

In some embodiments, with continued reference to FIG. 5, the driver chip 100 includes the first functional pin Q1 and the second functional pin Q2. The first functional pin Q1 and the second functional pin Q2 are located on two sides of the driver chip 100, respectively, and the two sides are relatively parallel to each other; the first functional pin Q1 and the second functional pin Q2 are electrically connected to each other.

The first functional pin Q1 is capable of receiving the test signal and send the test signal to the logic control module CTR; the logic control module CTR generates, according to the test signal, the test current flowing through each output pin OUT, and the test current may drive the light-emitting unit E to emit light.

The second functional pin Q2 is electrically connected to the first functional pin Q1. The second functional pin Q2 is capable of outputting the test signal to the next-stage driver chip 100. That is, a second functional pin Q2 of a former-stage driver chip 101 is capable of outputting the test signal to a first functional pin Q1 of a latter-stage driver chip 102, and a logic control module CTR of the latter-stage driver chip 102 generates, according to the test signal, a test current flowing through each output pin OUT of the latter-stage driver chip 102. As described above, the latter-stage driver chip 102 may be used to continuously output the test signal to a next-stage driver chip after the latter-stage driver chip 102.

For the driver chip 100 in the embodiments, the first functional pin Q1 may be used to provide the test signal to the logic control module CTR, and the logic control module CTR generates, according to the test signal, the test current flowing through each output pin OUT. The test current may drive the light-emitting unit E (as shown in FIG. 2) to emit light. The second functional pin Q2 is electrically connected to the first functional pin Q1, and the second functional pin Q2 is capable of outputting the test signal to the next-stage driver chip 100. With such a structure, the lighting test for the light-emitting units E electrically connected to the driver chips 100 may be achieved through one detection operation. If a light-emitting unit E emits light normally, it may be determined that the light-emitting unit E is connected normally. If the light-emitting unit E does not emit light, it may be determined that the light-emitting unit E has a problem, and repairing is needed. As a result, the repairing efficiency of the driver chips 100 is improved. First functional pins Q1 and second functional pins Q2 are arranged along a first direction X, which facilitates the wiring design.

In some embodiments, with continued reference to FIG. 5, the driver chip 100 further includes the second functional pin Q2 and a first connection line L1. The second functional pin Q2 is connected to the first functional pin Q1 through the first connection line L1. The second functional pin Q2 outputs the test signal to the next-stage driver chip. The driver chip 100 has the first edge W1 and the second edge W2 that are parallel to each other. One of the first functional pin Q1 and the second functional pin Q2 is close to the first edge W1, and the other one thereof is close to the second edge W2.

In the embodiments, as shown in FIG. 5, the first edge W1 is an upper edge of the driver chip 100, and the second edge W2 is a lower edge of the driver chip 100. A lower edge of the former-stage driver chip 101 is close to an upper edge of the latter-stage driver chip 102. Thus, for a same driver chip 100, the first functional pin Q1 is arranged close to the first edge W1, and the second functional pin Q2 is arranged close to the second edge W2. That is, a second functional pin Q2 of the former-stage driver chip 101 is close to a first functional pin Q1 of the latter-stage driver chip 102. An external connection line K1 may be used to make the second functional pin Q2 of the former-stage driver chip 101 and the first functional pin Q1 of the latter-stage driver chip 102 be electrically connected, thereby helping make full use of a space between two adjacent driver chips 100 that are cascaded, helping reduce a length of the external connection line K1, and facilitating a flexible arrangement of the external connection line K1. As a result, it facilitates subsequent wiring layout of light-emitting substrate.

For example, FIG. 5 illustrates an example in which the first functional pin Q1 is close to the first edge W1, and the second functional pin Q2 is close to the second edge W2.

In some examples, the first connection line L1 may be arranged in the driver chip 100. In some other examples, the first connection line L1 is arranged in the light-emitting substrate. That is, the first connection line L1 is located outside the driver chip 100. In the case where the first connection line L1 is located in the light-emitting substrate, an orthographic projection of the first connection line L1 on the light-emitting substrate is located between orthographic projections of the first functional pin Q1 and the second functional pin Q2 on the light-emitting substrate. That is, the first connection line L1 is located between two adjacent driver chips 100 that are cascaded, which may make full use of the space between two adjacent driver chips 100, and reduce left and right spaces of the driver chip 100 (e.g., left and right spaces of the driver chip 100 as shown in FIGS. 3 and 5) being occupied. Signal lines electrically connected to the driver chip 100 are distributed, which facilitates the wiring layout of the signal lines.

For example, FIG. 5 illustrates an example in which the first connection line L1 is a wire in the driver chip 100 and the first connection line L1 is a straight line. A shape of the first connection line L1 and a film layer position of first connection lines L1 are not specifically limited in the embodiments of the present disclosure, as long as the first connection line L1 is located between the first functional pin Q1 and the second functional pin Q2, and is connected to the first functional pin Q1 and the second functional pin Q2.

In some embodiments, the driver chip 100 further includes the data pin Data (as shown in FIG. 4). The data pin Data is used to be connected to a data signal line to receive the driving data, and the driving data includes the driving information and the address verification information. The logic control module CTR is further configured to: when the address verification information matches the address information of the driver chip 100, determine the driving information corresponding to the address verification information; generate, according to the driving information, driving current(s) corresponding to the at least one light-emitting unit E (as shown in FIG. 2) connected to the driver chip 100; and control the at least one output pin OUT of the driver chip 100 to form electrical path(s) with corresponding light-emitting unit(s) E. The driving current(s) are capable of flowing in the electrical path(s).

In some embodiments, with continued reference to FIG. 5, the driver chip 100 further includes the address pin Di and the relay pin Do. The address pin Di is electrically connected to the logic control module CTR, and the address pin Di is capable of receiving the driving data, and the driving data includes the address verification information and a plurality of pieces of driving information corresponding to a plurality of driver chips that are cascaded. The logic control module CTR is further configured to: obtain, according to the address verification information, a piece of driving information corresponding to the driver chip; update the address verification information, and generate driving data including updated address verification information. The relay pin Do is electrically connected to the logic control module, and the relay pin Do is capable of outputting the driving data including the updated address verification information to the next-stage driver chip 100.

It will be understood that, the address pin Di of the current-stage driver chip 100 is capable of receiving the driving data, and the driving data includes the address verification information of the current-stage driver chip 100 and the plurality of pieces of driving information corresponding to all the driver chips that are cascaded. The logic control module CTR of the current-stage driver chip 100 receives the driving data, and obtains, according to the address verification information in the driving data, the piece of driving information corresponding to the address verification information of the current-stage driver chip 100. The logic control module CTR generates, according to the piece of driving information, the driving current(s) corresponding to the at least one light-emitting unit E (as shown in FIG. 2) connected to the driver chip 100, and controls the at least one output pin OUT of the driver chip 100 to form the electrical path(s) with the corresponding light-emitting unit(s) E. The driving current(s) are capable of flowing in the electrical path(s).

In addition, the logic control module CTR of the current-stage driver chip 100 updates the address verification information to generate the driving data, and the driving data includes the updated address verification information. The relay pin Do is capable of outputting the updated address verification information to the next-stage driver chip 100.

For example, the logic control module CTR further updates the received driving data. That is, the logic control module CTR further updates the address verification information in the driving data. The address verification information in the driving data includes the number of start identification bits and/or the number of end identification bits. The number of start identification bits in the driving data is reduced by 1 and/or the number of end identification bits is increased by 1; and then the re-edited driving data is output to an address pin Di of the next-stage driver chip through the relay pin Do of the current-stage driver chip. Of course, the driver chip 100 may also adopt another different function to generate new address verification information.

It will be noted that the address pin Di of the driver chip 100 provided in the embodiments above may be used to receive the driving data. The driving data includes the address verification information and the plurality of pieces of driving information corresponding to the plurality of driver chips that are cascaded. The logic control module CTR of the current-stage driver chip 100 updates the address verification information to generate the driving data, and the driving data includes the updated address verification information. The relay pin Do is capable of outputting the updated address verification information to the next-stage driver chip 100. That is, the address pin Di achieves functions of both writing address and inputting driving information. Compared with a manner in which an address pin is used to receive address information and a data pin is used to receive driving data, the number of pins of the driver chip 100 may be reduced, thereby helping reduce the area ratio of the driver chip 100 and save resources, and facilitating a subsequent layout design of signal lines for the driver chip 100.

In some examples, an external circuit (e.g., a circuit board) may be provided with an encoder, and the logic control module CTR may be provided with a decoder. The encoder may perform encoding according to 4b/5b encoding protocol, 8b/10b encoding protocol or other encoding protocol to generate the driving data, and transmit the driving data to the address pin Di. The decoder of the logic control module CTR may decode the driving signal, and thus obtain the driving information and the address verification information in the driving data.

Some embodiments are described by taking an example in which the driver chip 100 has no data pin, but the address pin Di and the relay pin Do achieve receiving and transmitting of the driving data, respectively.

An address pin Di of a first-stage driver chip in N driver chips 100 that are sequentially cascaded in the light-emitting substrate 200 is connected to an address signal line, and the address signal line transmits the driving data. The driving data transmitted by the address signal line includes pieces of driving information, and the pieces of driving information are in one-to-one correspondence with the plurality of driver chips that are sequentially cascaded.

Figure 6:
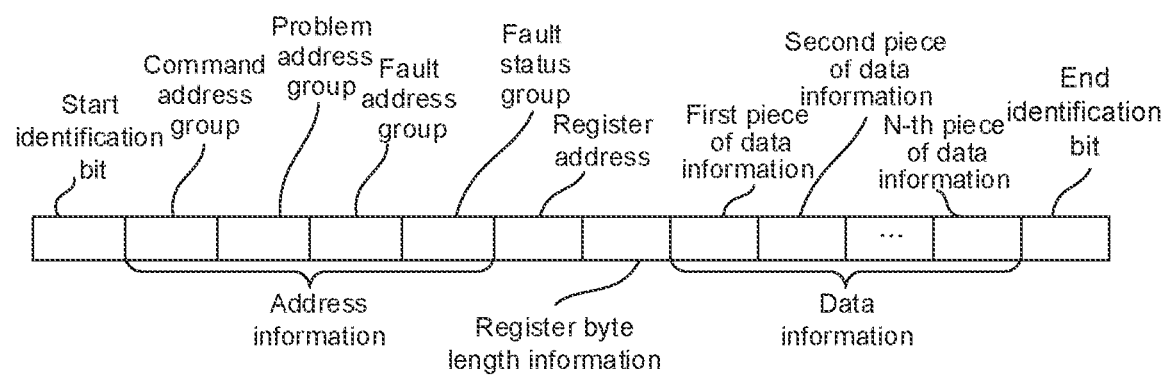
FIG. 6 is a schematic diagram a data format of driving data provided in some embodiments of the present disclosure.

FIG. 6 is a schematic diagram of a data format of the driving data provided in some embodiments of the present disclosure.

In some embodiments, referring to FIG. 6, the driving data is a digital signal composed of start identification bit(s), address information, a register address, register byte length information, data information and end identification bit(s).

A start identification bit and an end identification bit may each occupy n bits, where n is 1 or 8. The driving data may include a plurality of start identification bits and a plurality of end identification bits. A sum of the number of start identification bits and the number of end identification bits is constant. For example, the sum is N+1, where N is the number of the plurality of driver chips that are cascaded.

In some examples, the address information may include a plurality of groups, and each group occupies eight bits.

For example, the address information includes four groups, and the four groups are a command address group, a problem address group, a fault address group and a fault status group.

The command address group (dev addr) achieves different command controls by assigning values to the eight bits of the command address.

The problem address group (vled low dev addr) may feed back a location of the second voltage line where an electric potential abnormality occurs.

The fault address group (fault dev addr) may feed back address information of a faulty driver chip 100.

The fault status group (fault status) may feed back a specific status of the faulty driver chip 100.

For example, the address information may include only the command address.

The register address and the register byte length information each occupy eight bits. The register address corresponds to a (unique) physical address of a register unit in a certain driver chip, and the register byte length represents a data byte length to be reserved for the register unit, so as to facilitate the storage of configuration information.

The data information includes N pieces of 8-bit driving information, and the N pieces of driving information are arranged according to the cascaded sequence of the N driver chips.

It will be understood that a value may be assigned to any one bit in the driving data by means of pulse width modulation. For example, if a duty ratio of a certain bit is 50%, the bit represents a start of the driving data; if the duty ratio of a certain bit is 75%, the bit represents logic "1"; and if the duty ratio of a certain bit is 25%, the bit represents logic "0".

Figure 7:
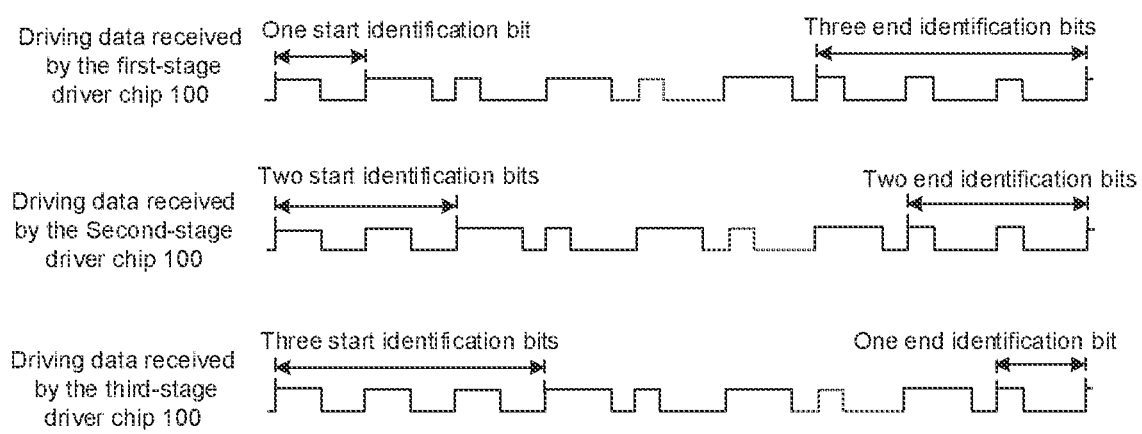
FIG. 7 is a schematic diagram another data format of driving data provided in some embodiments of the present disclosure.

FIG. 7 is a schematic diagram of another data format of the driving data provided in some embodiments of the present disclosure.

In some examples, the address pin Di of the first-stage driver chip in the N driver chips that are sequentially cascaded is connected to the address signal line 20, and the address signal line transmits the driving data. The address signal line 20 transmits driving data corresponding to a current display frame. An address pin Di of an n-th stage of driver chip and a relay pin Do of an (n−1)-th stage of driver chip are connected, and n is a positive integer greater than 1 and less than or equal to N. Each of the N driver chips that are sequentially cascaded receives driving data with a fixed length; the number of start identification bits in the driving data received by each driver chip is different from the number of start identification bits in the driving data received by another driver chip, and/or the number of end identification bits in the driving data received by each driver chip is different from the number of end identification bits in the driving data received by another driver chip. The number of start identification bits received by a driver chip corresponds to an order of the driver chip in the cascaded sequence. Considering an example in which N is equal to 3 (N=3), there are three driver chips sequentially cascaded in total, driving data received by the first-stage driver chip 100 and provided by the address signal line 20 includes one start identification bit and three successive end identification bits; driving data received by an address pin Di of a second-stage driver chip 100 and output from the relay pin Do of the first-stage driver chip 100 includes two successive start identification bits and two successive end identification bits; and driving data received by an address pin Di of the third-stage driver chip 100 and output from the relay pin Do of the second-stage driver chip 100 includes three successive start identification bits and one end identification bit. For the driving data received by each of the N driver chips that are sequentially cascaded, except for the number of start identification bits and/or the number of end identification bits, the number of other data is exactly the same. The other data may specifically include: the address information, the registers address, the register byte length information and the data information (i.e., as shown in the data format in FIG. 6). The data information includes three pieces of 8-bit driving information, and the three pieces of driving information are arranged according to the cascaded sequence of the three driver chips that are sequentially cascaded. It will be understood that, after an address pin Di of each driver chip 100 receives the driving data, a logic control module CTR of the driver chip 100 obtains only the driving information corresponding to the driver chip in the driving data, so that the driver chip provides, according to the driving information, the driving current to the light-emitting unit E electrically connected thereto. In addition, the logic control module CTR of the driver chip 100 further re-edits the received driving data, reduces the number of start identification bits in the driving data by 1 and/or increases the number of end identification bits in the driving data by 1, and outputs the re-edited driving data to the address pin Di of the next-stage driver chip through the relay pin Do of the driver chip 100.

It will be understood that, in the cases above, the address verification information in the driving data includes the number of start identification bits and/or the number of end identification bits.

In some embodiments, with continued reference to FIG. 5, the test signal includes a switch signal. The switch signal is used to control the logic control module CTR to generate the test current flowing through each output pin OUT.

In this case, the logic control module CTR generates, according to the switch signal, the test current flowing through each output pin OUT. That is, the light-emitting unit E (as shown in FIG. 2) electrically connected to the output pin OUT of the driver chip 100 may be controlled to receive the test current. In addition, the second functional pin Q2 is capable of outputting the test signal to the next-stage driver chip 100. In this way, light-emitting units E connected to the plurality of driver chips 100 that are cascaded arranged may all receive the test current to emit light. Therefore, the lighting test for the light-emitting units E electrically connected to the driver chips 100 may be achieved through one detection operation. If a light-emitting unit E does not emit light, it may be determined that the light-emitting unit E has a problem. As a result, the repairing efficiency of the driver chips 100 is effectively improved.

In some examples, the test signal may be a high-level signal or a low-level signal, as long as the test signal may be used to control the logic control module CTR to generate the test current flowing through each output pin OUT.

It will be noted that, at least one output pin OUT of the driver chip 100 is electrically connected to a terminal of the light-emitting unit E, and the other terminal of the light-emitting unit E is electrically connected to the second voltage line (not shown in the figure). The second voltage line is used to provide an operating voltage to the light-emitting unit E, and the ground pin GND may provide a ground voltage to the driver chip 100. In this way, it is equivalent to the light-emitting unit E being connected between the second voltage line and the ground pin GND. The logic control module CTR controls the current path of the light-emitting unit E to be turned on or off according to the test signal, and thus controls a current passing the light-emitting unit E and the output pin OUT. In this case, when the first functional pin Q1 receives the test signal and sends the test signal to the logic control module CTR, the logic control module CTR controls the light-emitting current path of the light-emitting unit E to be turned on or off through the test signal, and thus controls the test current passing the light-emitting unit E and the output pin OUT.

In some embodiments, in the case where "the test signal includes the switch signal, and the switch signal is used to control the logic control module CTR to generate the test current flowing through each output pin OUT", an address pin Di may be provided to receive the driving data.

For the driver chip 100 with such a structure, the lighting test for the light-emitting units E electrically connected to the driver chips 100 may be achieved through one detection operation, which effectively improves the repairing efficiency of the driver chips 100, and will not increase the number of pins of the driver chip 100, thereby facilitating the subsequent layout design of the signal lines for the driver chip 100.

In some other embodiments, with continued reference to FIG. 5, the test signal includes test data and first general address information. The first general address information is capable of matching initialization address information of any one driver chip 100. The logic control module CTR is configured to generate, according to the test data, the test current flowing through each output pin OUT.

The driver chips 100 each are set with a same initialization address when leaving the factory. For example, the initialization address may include a plurality of successive bits of 0 or 1. The first general address information in the test signal is set to be the same as the initialization address of the driver chip 100. That is, in a case where the initialization address includes successive bits of 0, the general address is correspondingly set to have successive bits of 0. In this way, the first general address information matches the initialization address information of all driver chips 100, so that the logic control module CTR of the driver chip 100 obtains the test data in the test signal and generates the test current flowing through each output pin OUT. The light-emitting unit E receives the test current to emit light. Therefore, the lighting test for the light-emitting units E electrically connected to the driver chips 100 may be achieved through one detection operation. As a result, the repairing efficiency of the driver chips 100 is effectively improved.

It will be noted that, at least one output pin OUT of the driver chip 100 is electrically connected to the terminal of the light-emitting unit E, and the other terminal of the light-emitting unit E is electrically connected to the second voltage line (not shown in the figure). The second voltage line is used to provide the operating voltage to the light-emitting unit E, and the ground pin GND may provide the ground voltage to the driver chip 100. In this way, it is equivalent to the light-emitting unit E being connected between the second voltage line and the ground pin GND. The logic control module CTR identifies the address information and obtains the test data in the test signal. The logic control module CTR controls the current path of the light-emitting unit E to be turned on or off according to the test data, and thus controls the current passing the light-emitting unit E and the output pin OUT. In this case, when the first functional pin Q1 receives the test signal and sends the test signal to the logic control module CTR, the logic control module CTR identifies the first general address information and obtains the test data in the test signal. The logic control module CTR controls the light-emitting current path of the light-emitting unit E to be turned on or off according to the test data, and thus controls the test current passing the light-emitting unit E and the output pin OUT.

In some embodiments, with continued reference to FIG. 5, the first functional pin Q1 receives the test signal and the driving data in a time-sharing manner. For example, the first functional pin Q1 receives the test signal in a period, and receives the driving data in another period.

In the case where the first functional pin Q1 receives the test signal, the test signal includes the test data and the first general address information. The first general address information is capable of matching the initialization address information of any one driver chip 100. The logic control module CTR is configured to generate, according to the test data, the test current flowing through each output pin OUT.

After a first functional pin Q1 of a driver chip 100 in each stage receives the test signal, a logic control module CTR thereof may analyze the first general address information to obtain corresponding test data. Therefore, the driver chip provides, according to the test data, the test current to the light-emitting unit E electrically connected thereto. In addition, the second functional pin Q2 is directly electrically connected to the first functional pin Q1 through the first connection line L1. Thus, the test signal received by the first functional pin Q1 may be transmitted to the first functional pin Q1 of the next-stage driver chip through the second functional pin Q2.

For the driver chip in each stage in the N driver chips that are sequentially cascaded, the first functional pin Q1 and the second functional pin Q2 receive the same driving data; the driving data includes N pieces of address verification information and N pieces of driving information, a piece of address verification information and a piece of driving information constitute an array, and N arrays are sequentially arranged. For example, N arrays may be sequentially arranged according to the cascaded sequence of the N driver chips, or be arranged in an irregular order. The logic control module CTR is further configured to: when a piece of address verification information matches the address information, receive a corresponding piece of driving information according to the piece of address verification information; generate, according to the driving information, driving current corresponding to the at least one light-emitting unit E (as shown in the FIG. 2) connected to the driver chip 100; and control at least one output pin OUT of the driver chip 100 to form electrical path(s) with corresponding light-emitting unit(s) E. The driving current(s) flow in the electrical path(s).

For the driver chip 100 in each stage, after the first functional pin Q1 receives the driving data, the logic control module CTR obtains only the driving information corresponding to the driver chip in the driving data, so that the driver chip provides, according to the driving information, the driving current to the light-emitting unit E electrically connected thereto. In addition, the logic control module CTR further outputs the received driving data to the first functional pin Q1 of the next-stage driver chip through the second functional pin Q2 of the driver chip 100.

It will be noted that, for the driver chip 100 in each stage, after the first functional pin Q1 receives the driving data, the logic control module CTR obtains only the driving information corresponding to the driver chip in the driving data, so that the driver chip provides, according to the driving information, the driving current to the light-emitting unit E electrically connected thereto. In addition, since the second functional pin Q2 is directly electrically connected to the first functional pin Q1 through the first connection line L1, the driving data received by the first functional pin Q1 may be transmitted to the first functional pin Q1 of the next-stage driver chip through the second functional pin Q2.

To sum up, for a driver chip 100, a processing on the test signal by the first functional pin Q1 after the test signal is received is similar to the processing on the driving data by the data pin Data after the driving data is received. Thus, the first functional pin Q1 may be used to receive the test signal and the driving data in the time-sharing manner. In a testing phase of the driver chip 100, the first functional pin Q1 is used to receive the test signal; in a normal working phase of the driver chip 100, the first functional pin Q1 is used to receive the driving data. In the embodiments, in the case where the first functional pin Q1 receives the test signal and the driving data in the time-sharing manner, no data pin Data is needed to be provided in the driver chip 100, which helps reduce the area ratio of the driver chip 100 and save resources. In addition, since the driving data received by the first functional pin Q1 may be output to the first functional pin Q1 of the next-stage driver chip through the second functional pin Q2, it also facilitates the layout of wirings for providing signals to the driver chip 100 in the light-emitting substrate.

In some embodiments, with continued reference to FIG. 5, the driver chip 100 includes the address pin Di and the relay pin Do. The address pin Di may receive address signal. The address information of the driver chip 100 is configured according to the address signal, and the relay signal is generated. The relay pin Do is capable of outputting the relay signal. That is, initialization address information of each driver chip 100 is updated.

In some examples, the initialization address information and the address signal may be digital signals of a same type. For example, the initial address information is 0. After a driver chip 100 receives the address signal, the driver chip 100 may analyze, obtain and store the address information in the address signal, and may further increase the address signal by 1 or another non-zero fixed amount, and modulate the incremented address signal (a new address signal) into the relay signal. The relay signal serves as an address signal for the next-stage driver chip 100. Of course, the driver chip 100 may also adopt another different function to update the address signal.

After the address pin Di receives the address signal, the first functional pin Q1 is used to receive the driving data. The driving data includes a plurality of pieces of address verification information and a plurality of pieces of driving information corresponding to the plurality of pieces of address verification information. For any one driver chip, when a piece of address verification information matches the address information, the driver chip receives a corresponding piece of driving information according to the piece of address verification information, and generate the driving current corresponding to the at least one output pin OUT according to the received driving information. That is, the driver chip 100 generates the driving current(s) corresponding to the at least one light-emitting unit E connected thereto, and controls the at least one output pin OUT thereof to form the electrical path(s) with the corresponding light-emitting unit(s) E. The driving current(s) flow in the electrical path(s), and the light-emitting unit(s) E receive the driving current(s) and emit light.

In addition, the second functional pin Q2 is capable of outputting the driving data to the next-stage driver chip.

It will be understood that, in an address configuration phase, if a problem exists in soldering at the address pin Di of the driver chip 100, the address information of the driver chip 100 cannot be updated, and if a problem exists in soldering at the relay pin Do of the driver chip 100, address information of driver chips in next stages cannot be updated. Considering an example in which a piece of address information occupies 8 bits, updated pieces of address information of first four driver chips 100 are 00000001, 00000010, 00000011, and 00000100. For example, if a problem exists inside a fifth driver chip 100 or in a connection between the fifth driver chip and a sixth driver chip, for subsequent driver chips 100 that are cascaded and start from the fifth driver chip, address information is not updated and is still the initial address information 00000000. For each of the first four driver chips, since address verification information in the driving data matches the updated address information of the driver chip, the first four driver chips 100 may obtain corresponding driving information from the driving data. That is, light-emitting units E electrically connected to the first four driver chips 100 may normally emit light. In this case, it is assumed that all light-emitting units E are soldered normally, for the subsequent driver chips 100 that are cascaded and start from the fifth driver chip, corresponding driving information cannot be obtained from the driving data. That is, for the subsequent driver chips 100 that are cascaded and start from the fifth driver chip, no driving current can be obtained from the address information, so that light-emitting units E electrically connected thereto cannot emit light.

Based on this, it may be determined according to whether all light-emitting units E electrically connected to the driver chips 100 emit light. If starting from a certain driver chip 100, light-emitting units E electrically connected to subsequent driver chips 100 all do not emit light, it may be determined that a problem exists inside the driver chip 100 or in the connection between the driver chip and a next-stage driver chip 100, and repairing is needed.

In addition, for the driver chip 100 provided in the embodiments of the present disclosure, no data pin needs to be provided, and the first functional pin Q1 and the second functional pin Q2 achieve receiving and transmitting of the driving data, respectively. As a result, it helps reduce the area ratio of the driver chip 100 and save resources; it also facilitates the subsequent layout of wirings for providing signals to the driver chip 100.

In yet other embodiments, the address pin Di may receive the address signal. The logic control module CTR configures the address information of the driver chip 100 according to the address signal, and generates the relay signal according to the received address information. The relay pin Do is capable of outputting the relay signal. That is, the initialization address information of each driver chip 100 is updated.

In some examples, the initialization address information and the address signal may be digital signals of the same type. For example, the initial address information is 0. After a driver chip 100 receives the address signal, the driver chip 100 may analyze, obtain and store the address information in the address signal, and may further increase the address signal by a fixed amount; the incremented address signal serves as the relay signal, and the relay signal serves as the address signal for the next-stage driver chip 100. In a case where the fixed amount is 0, address signals of all driver chips 100 are the same. Of course, the driver chip 100 may also adopt another different function to update the address signal.

In the case where the first functional pin Q1 receives the test signal, the test signal includes the test data and second general address information. The second general address information is capable of matching the address information of any one driver chip 100. The logic control module CTR is configured to generate, according to the test signal, the test current flowing through each output pin OUT.

It will be understood that, in the address configuration phase, if a problem exists inside a certain driver chip or in the connection between the driver chip and a next-stage driver chip 100, address information of the driver chip and subsequent driver chips that are cascaded cannot be updated. For example, the updated address information of each of the first four driver chips 100 is 11111111, and for each of subsequent driver chips 100 starting from the fifth driver chip, the address information is still the initial address information 00000000. The second general address information in the test signal is preset as 11111111, which may match the updated address information of the first four driver chips 100. That is, the light-emitting units E electrically connected to the first four driver chips 100 may emit light normally. In this case, it is assumed that all light-emitting units E are soldered normally, for the subsequent driver chips 100 starting from the fifth driver chip 100, the second general address information in the test signal cannot match the address information (the address information after the initialization information is updated). That is, for each of the subsequent driver chips 100 starting from the fifth driver chip 100, a logic control module cannot obtain driving information from the driving data, so that light-emitting units E electrically connected thereto cannot emit light.

Based on this, it may be determined according to whether all light-emitting units E electrically connected to the driver chips 100 emit light. If starting from a certain driver chip 100, light-emitting units E electrically connected to subsequent driver chips 100 all do not emit light, it may be determined that a problem exists in the soldering at the address pin Di and the relay pin Do of the driver chip 100, and repairing is needed.

In some embodiments, with continued reference to FIG. 5, the driver chip 100 further has a third edge W3 located between a first end of the first edge W1 and a first end of the second edge W2. In the case where the driver chip 100 includes the address pin Di and the relay pin Do, one of the address pin Di and the relay pin Do is close to the first edge W1, and the other one thereof is close to the second edge W2. The address pin Di and the relay pin Do are both closer to the third edge W3 than the first functional pin Q1 and the second functional pin Q2.

In the embodiments, one of the address pin Di and the relay pin Do is arranged to be close to the first edge W1, and the other one thereof is arranged to be close to the second edge W2. As shown in FIG. 5, the first edge W1 is the upper edge of the driver chip 100, and the second edge W2 is the lower edge of the driver chip 100. The lower edge of the former-stage driver chip 101 is close to the upper edge of the latter-stage driver chip 102.

Thus, for a same driver chip 100, the address pin Di is arranged close to the first edge W1, and the relay pin Do is arranged close to the second edge W2. That is, the relay pin Do of the former-stage driver chip 101 is close to the address pin Di of the latter-stage driver chip 102. An external connection line K2 may be used to make the relay pin Do of the former-stage driver chip 101 to be electrically connected to the address pin Di of the latter-stage driver chip 102, so that the address pin Di of the former-stage driver chip 101 receives the address signal, and the logic control module CTR of the former-stage driver chip 101 configures the address information of the former-stage driver chip 101 according to the address signal, and generates the relay signal. The relay signal can serve as an address signal for the latter-stage driver chip 102, and the relay pin Do of the former-stage driver chip 101 sends the relay signal to the address pin Di of the latter-stage driver chip 102. Thus, dynamic addresses are allocated to the driver chips 100 that are cascaded.

In addition, the address pin Di is arranged close to the first edge W1, and the relay pin Do is arranged close to the second edge W2, which also helps reduce a length of the external connection line K2, and facilitates a flexible arrangement of the external connection line K2. As a result, it facilitates the subsequent wiring layout of the light-emitting substrate.

Furthermore, the address pin Di and the relay pin Do are both arranged closer to the third edge W3 than the first functional pin Q1 and the second functional pin Q2. That is, the address pin Di and the relay pin Do are arranged at an upper side and a lower side of the third edge W3, respectively, and the address pin Di and the relay pin Do are closest to the third edge W3. Thus, it facilitates the connection of the address signal line outside the driver chip 100, thereby facilitating the subsequent wiring layout of the light-emitting substrate.

For example, FIG. 5 illustrates an example in which the address pin Di is arranged close to the first edge W1 and the relay pin Do is arranged close to the second edge W2. It will be understood that, in some other embodiments, the address pin Di may be arranged close to the second edge W2, and the relay pin Do is arranged close to the first edge W1 for illustration. In some embodiments of the present disclosure, positions of the address pin Di and the relay pin Do of the driver chip 100 may be flexibly set, as long as the relay pin Do of the former-stage driver chip 101 is close to the address pin Di of the latter-stage driver chip 102.

For example, FIG. 5 illustrates an example in which an end of the third edge W3 is directly connected to the first edge W1 and another end of the third edge W3 is directly connected to the second edge W2. It will be understood that, in some other embodiments, the third edge W3 and the first edge W1 are connected through another edge. In yet other embodiments, the third edge W3 and the second edge W2 are connected through another edge.

Figure 8:
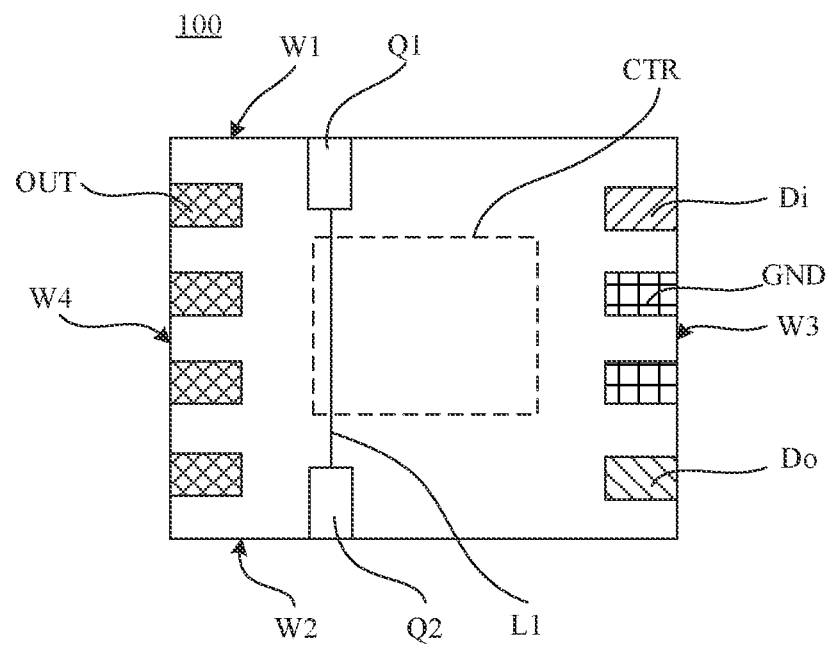
FIG. 8 is a structural diagram of a driver chip provided in some other embodiments of the present disclosure.

FIG. 8 is a structural diagram of the driver chip provided in yet other embodiments of the present disclosure.

In some embodiments, referring to FIG. 8, the driver chip 100 further includes at least one ground pin GND electrically connected to the logic control module CTR. The ground pin GND is capable of receiving a ground signal; the ground pin GND is located between the address pin Di and the relay pin Do.

In the embodiments, the driver chip 100 further includes at least one ground pin GND for receiving the ground signal. FIG. 8 illustrates an example in which the driver chip 100 includes two ground pins GND. It will be understood that, in some other embodiments, the driver chip 100 may include one, three or four ground pins, which may be set according to needs. The ground pins GND are arranged close to the third edge W3, and located between the address pin Di and the relay pin Do, so that the ground pins GND may be concentrated in a middle region of the driver chip 100 close to the third edge W3. As a result, it facilitates the subsequent electrical connection between the ground pins GND and a ground line, thereby avoiding the ground line being overlapped with other wirings.

Figure 9:
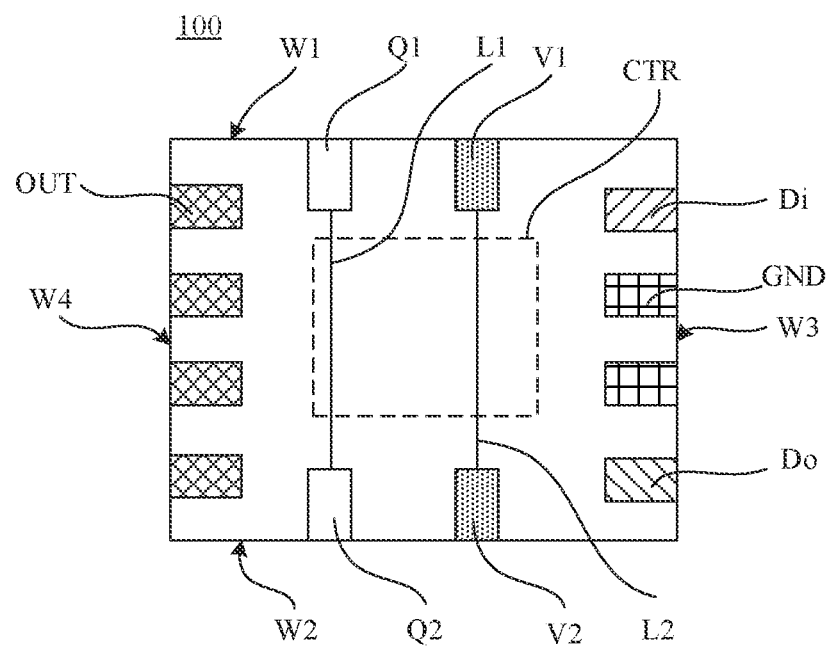
FIG. 9 is a structural diagram of a driver chip provided in yet other embodiments of the present disclosure.
Figure 10:
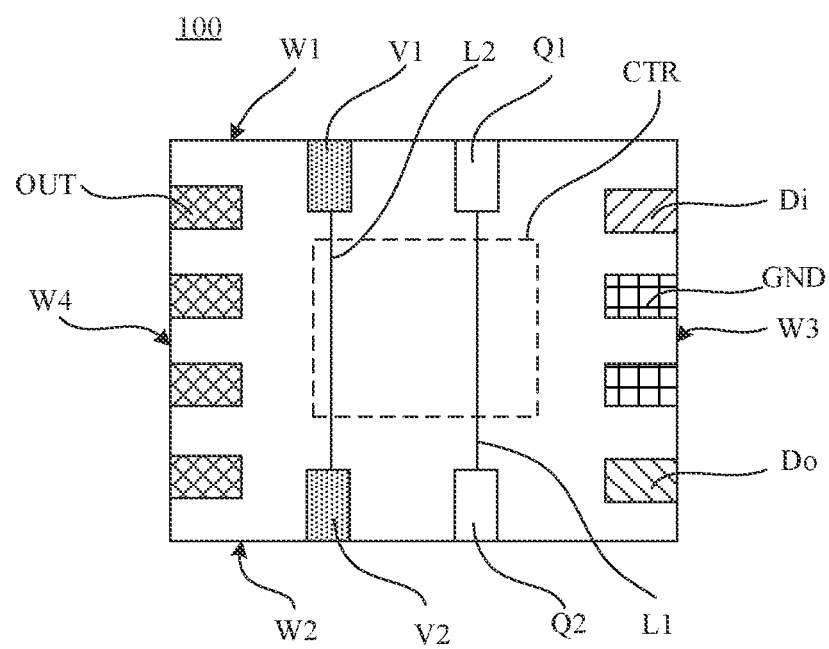
FIG. 10 is a structural diagram of a driver chip provided in yet other embodiments of the present disclosure.

FIG. 9 is a structural diagram of the driver chip provided in yet other embodiments of the present disclosure; FIG. 10 is a structural diagram of the driver chip provided in yet other embodiments of the present disclosure.

In some embodiments, referring to FIGS. 9 and 10, the driver chip 100 further includes a first power supply pin V1. The first power supply pin V1 is electrically connected to the logic control module CTR. The first power supply pin V1 is capable of receiving a power supply signal. The first power supply pin V1 is close to the first edge W1 or the second edge W2, and the first power supply pin V1 is farther away from the third edge W3 than the address pin Di and the relay pin Do.

In the embodiments, for the driver chip 100, the first power supply pin V1 is used to receive the power supply signal, and the power supply signal required by the driver chip 100 is provided so that the normal working of the driver chip 100 is ensured.

The first power supply pin V1 is arranged close to the first edge W1 or the second edge W2. As shown in FIGS. 9 and 10, FIGS. 9 and 10 each illustrate an example in which the first power supply pin V1 is close to the first edge W1. It will be understood that, in some other embodiments, the first power supply pin V1 may also be arranged close to the second edge W2. Based on this, the first power supply pin V1 is close to the upper edge or the lower edge of the driver chip 100. By arranging a first power supply pin V1 of each of the plurality of driver chips 100 to be close to an upper edge or a lower edge of a corresponding driver chip 100, it may be possible to make full use of the space between two adjacent driver chips 100, thereby facilitating the wiring design.

In addition, the first power supply pin V1 being arranged farther away from the third edge W3 than the address pin Di and the relay pin Do may include following two cases.

In a first case, referring to FIG. 9, the first power supply pin V1 is located between the first functional pin Q1 and the address pin Di.

In a second case, referring to FIG. 10, the first functional pin Q1 is located between the first power supply pin V1 and the address pin Di.

Regardless of the first case or the second case, it will be understood that, the address pin Di and the relay pin Do each are arranged at a position closest to the third edge W3, which facilitates the address pin Di being connected to the address signal line outside the driver chip 100, and facilitates the subsequent wiring layout of the light-emitting substrate.

In some embodiments, referring to FIGS. 9 and 10, the driver chip 100 further includes a second power supply pin V2 and a second connection line L2. The second power supply pin V2 is connected to the first power supply pin V1 through the second connection line L2. One of the first power supply pin V1 and the second power supply pin V2 is close to the first edge W1, and the other one thereof is close to the second edge W2. The first power supply pin V1 and the second power supply pin V2 are both farther away from the third edge W3 than the address pin Di and the relay pin Do.

In the embodiments, the first power supply pin V1 is electrically connected to the second power supply pin V2 of the current-stage driver chip 100 through the second connection line L2. The first power supply pin V1 and the second power supply pin V2 of the current-stage driver chip 100 receive the same signal. Thus, the power supply signal may be output to a first power supply pin V1 of the next-stage driver chip 100 through the second power supply pin V2, which facilitates the wiring design for the driver chips 100 that are cascaded to each other.

Based on this, one of the first power supply pin V1 and the second power supply pin V2 is arranged close to the first edge W1, and the other one thereof is close to the second edge W2. As shown in FIGS. 7 and 8, the first edge W1 is the upper edge of the driver chip 100, and the second edge W2 is the lower edge of the driver chip 100. The lower edge of the former-stage driver chip 101 is close to the upper edge of the latter-stage driver chip 102.

Thus, the first power supply pin V1 is arranged close to the first edge W1, and the second power supply pin V2 is arranged close to the second edge W2. That is, the first power supply pin V1 is close to the upper edge of the driver chip 100, and the second power supply pin V2 is close to the lower edge of the driver chip 100. As a result, it facilitates the connection between the second power supply pin V2 of the current-stage driver chip 100 and the first power supply pin V1 of the next-stage driver chip 100, so that the second power supply pin V2 can output the power supply signal to the next-stage driver chip 100.

In addition, it may be determined whether the second functional pin Q2 needs to be provided according to the total number of pins of the driver chip 100, so as to ensure that the total number of pins of the driver chip 100 is an even number.

In some examples, the second connection line L2 may be a wire inside the driver chip 100. In some other examples, the second connection line L2 may be a wire that is located outside the driver chip 100 and in the light-emitting substrate. In the case where the second connection line L2 is located in the light-emitting substrate, an orthographic projection of the second connection line L2 on the light-emitting substrate is located between orthographic projections of the first power supply pin V1 and the second power supply pin V2 on the light-emitting substrate.

That is, the second connection line L2 is located between two adjacent driver chips 100 that are cascaded, which may make full use of the space between two adjacent driver chips 100, and reduce left and right spaces of the driver chip 100 (e.g., left and right spaces of the driver chip 100 as shown in FIGS. 9 and 10) being occupied. The signal lines electrically connected to the driver chip 100 are distributed, which facilitates the wiring layout of the signal lines.

For example, FIGS. 9 and 10 each illustrate an example in which the second connection line L2 may be the wiring inside the driver chip 100, and the second connection line L2 is a straight line. A shape of the second connection line L2 and a film layer position of second connection lines L2 are not specifically limited in the embodiments of the present disclosure, as long as the second connection line L2 is located between the first power supply pin V1 and the second power supply pin V2, and is connected to the first power supply pin V1 and the second power supply pin V2.

For example, FIGS. 9 and 10 each illustrate an example in which the first power supply pin V1 is close to the first edge W1 and the second power supply pin V2 is close to the second edge W2. It will be understood that, in some other embodiments, the first power supply pin V1 may also be arranged close to the second edge W2, and the second power supply pin V2 is close to the first edge W1, as long as a second power supply pin V2 and a first power supply pin V1 in two adjacent driver chips 100 are close to each other.

"The first power supply pin V1 and the second power supply pin V2 being both farther away from the third edge W3 than the address pin Di and the relay pin Do" may include following two cases.

In a first case, referring to FIG. 9, the first power supply pin V1 is located between the first functional pin Q1 and the address pin Di, and the second power supply pin V2 is located between the second functional pin Q2 and the relay pin Do.

In a second case, referring to FIG. 10, the first functional pin Q1 is located between the first power supply pin V1 and the address pin Di, and the second functional pin Q2 is located between the second power supply pin V2 and the relay pin Do.

Regardless of the first case or the second case, it will be understood that, the address pin Di and the relay pin Do each are arranged at the position closest to the third edge W3, which facilitates the address pin Di being connected to the address signal line outside the driver chip 100, and facilitates the subsequent wiring layout of the light-emitting substrate.

Figure 11:
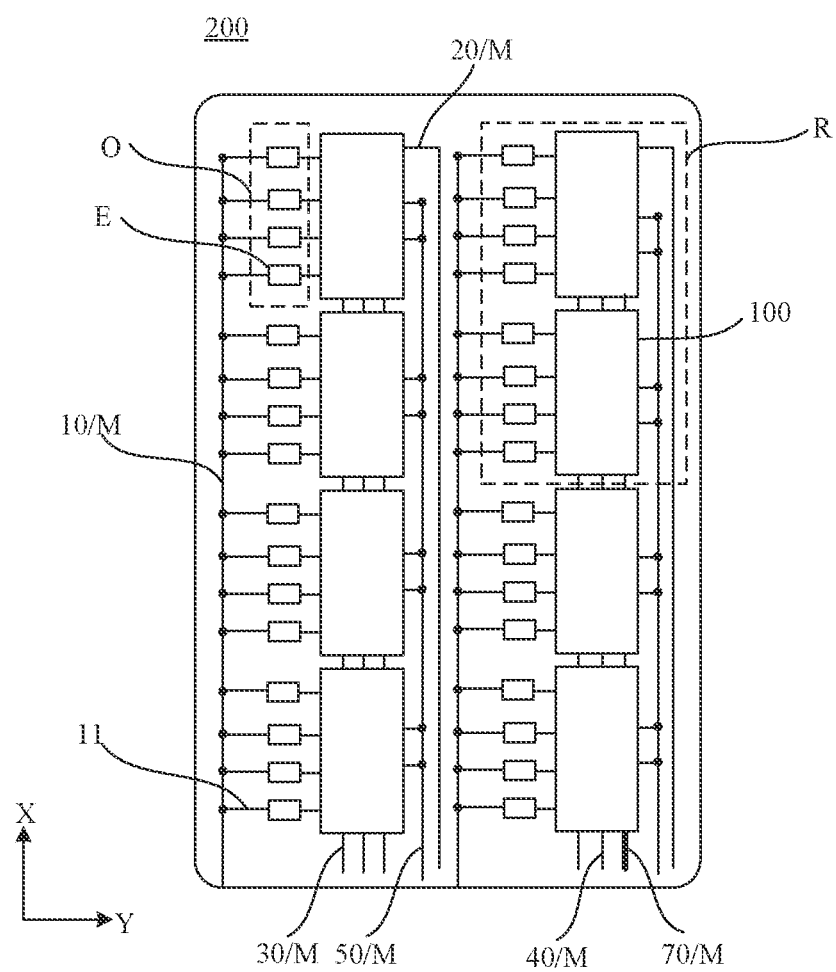
FIG. 11 is a structural diagram of a light-emitting substrate provided in some other embodiments of the present disclosure.
Figure 12:
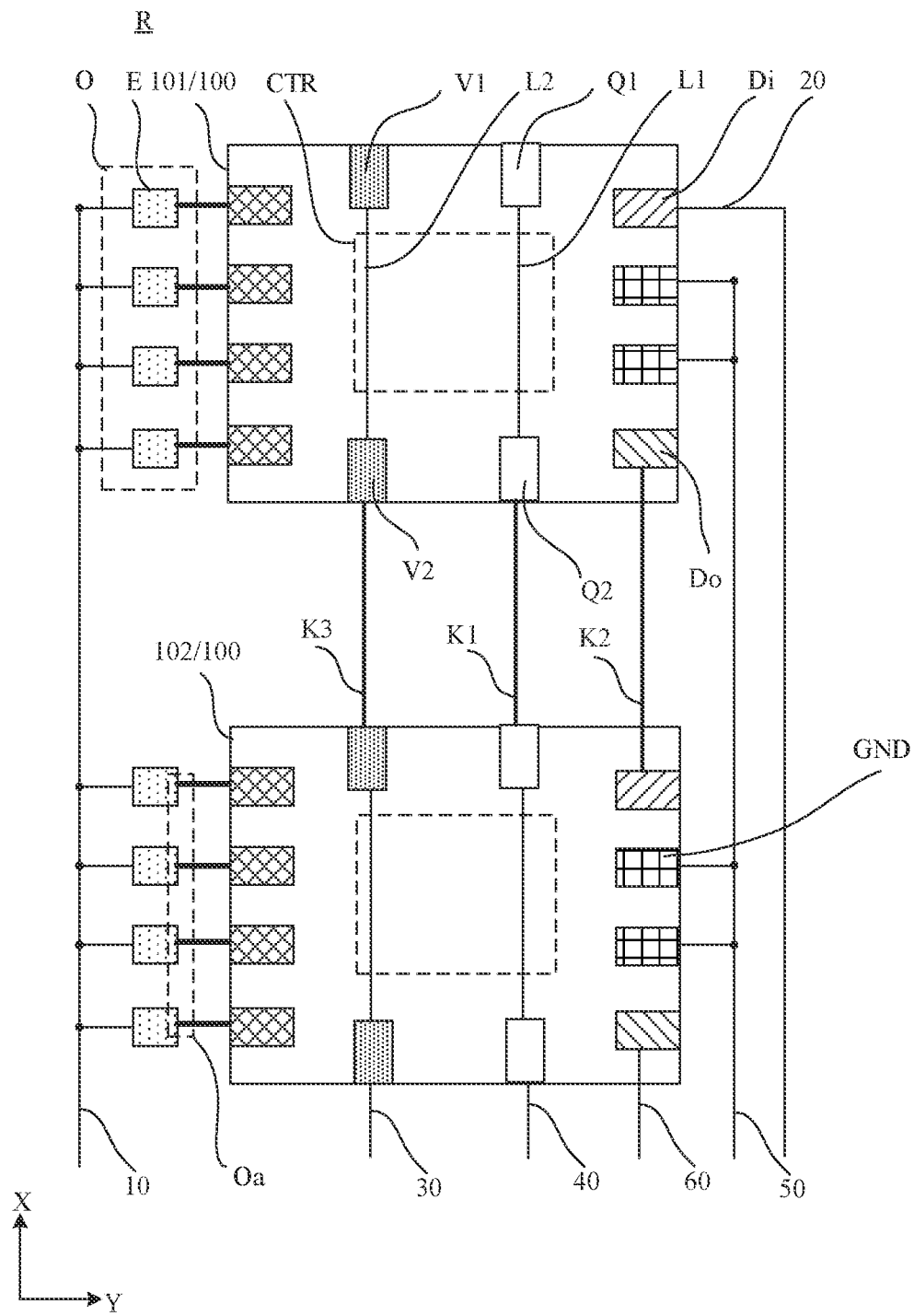
FIG. 12 is a partial enlarged view of the region R in FIG. 11.

FIG. 11 is a structural diagram of the light-emitting substrate provided in some other embodiments of the present disclosure; FIG. 12 is a partial enlarged view of the region R in FIG. 11.

Some embodiments of the present disclosure provide the light-emitting substrate 200. Referring to FIGS. 11 and 12, the light-emitting substrate 200 includes a plurality of driver chips 100 that are cascaded and a plurality of device groups O. The driver chip 100 is the driver chip 100 described in any one of the embodiments above. A first terminal Oa of a device group O is electrically connected to at least one output pin OUT of a corresponding driver chip 100.

In some examples, the device group O includes at least one light-emitting unit E. For example, a light-emitting unit E may include at least one light-emitting element. The light-emitting unit E may include only one light-emitting element; or the light-emitting unit E may include two or more light-emitting elements electrically connected to each other. In the case where the light-emitting unit E includes two or more light-emitting elements, the two or more light-emitting elements may be connected in series or in parallel, or in a combination of series and parallel.

For example, "the first terminal Oa of the device group O being electrically connected to at least one output pin OUT of the corresponding driver chip 100" may be that light-emitting units E in the device group O and output pins OUT of the driver chip 100 are in a one-to-one correspondence. The number of light-emitting units E electrically connected to each output pin OUT is not limited in the embodiments of the present disclosure, which may be adjusted according to actual needs. For example, as shown in FIG. 12, the driver chip 100 includes four output pins OUT, the device group O includes four light-emitting units E, and one output pin OUT is electrically connected to one light-emitting unit E.

In the embodiments, the first functional pin Q1 of each driver chip 100 may be used to provide the test signal to a corresponding logic control module CTR, and the logic control module CTR generates a test current flowing through each output pin OUT. The test current may drive the light-emitting unit E to emit light. That is, light-emitting units E electrically connected to all driver chips 100 may receive the test current under normal conditions. Thus, the lighting test for the light-emitting units E electrically connected to the driver chips 100 may be achieved through one detection operation. If a light-emitting unit E emits light normally, it may be determined that the light-emitting unit E is connected normally. If the light-emitting unit E does not emit light, it may be determined that the light-emitting unit E has a problem, and repairing is needed. As a result, the repairing efficiency of the driver chips 100 is effectively improved.

In some embodiments, with continued reference to FIGS. 11 and 12, in the case where the driver chip 100 further includes the address pin Di, the relay pin Do, the first power supply pin V1 and the at least one ground pin GND, a relay pin Do of a former-stage driver chip 100 is electrically connected to an address pin Di of a latter-stage driver chip 100. The light-emitting substrate 200 further includes a conductive layer M. The conductive layer M includes: a second voltage line 10, an address signal line 20, a first voltage line 30, a test signal line 40 and a ground line 50.

The second voltage line 10 extends along the first direction X, and light-emitting units E in the device group O are arranged along the first direction X. The second voltage line 10 is arranged to be electrically connected to second terminals of the device groups. That is, the second voltage line 10 is electrically connected to at least one light-emitting unit E in each device group O to provide the light-emitting unit E with a driving voltage. In addition, since the light-emitting units E in the device group O are arranged along the first direction X, in a case where all the light-emitting units E in the device group O are connected to the same second voltage line 10, the light-emitting units E may be connected to the second voltage line 10 through conductive lines 11 extending in the direction Y. The conductive lines 11 do not overlap with each other, which facilitates a single-layer wiring design for the light-emitting substrate 200. For example, the conductive lines 11 are parallel to each other. The first direction X and the second direction Y intersect and are perpendicular to a thickness direction of the light-emitting substrate 200. As shown in FIGS. 11 and 12, the first direction X and the second direction Y are perpendicular to each other. It will be understood that, in some other embodiments, an included angle between the first direction X and the second direction Y may be an obtuse angle or an acute angle.

In some examples, the plurality of driver chips 100 that are cascaded are arranged along the first direction X. In a case where the plurality of driver chips 100 that are cascaded are connected to the same second voltage line 10, the driver chips 100 may be connected to the second voltage line 10 through conductive lines 11 extending in the second direction Y. The conductive lines 11 do not overlap with each other, which facilitates the single-layer wiring design for the light-emitting substrate 200. For example, the conductive lines 11 are parallel to each other.

Any one device group O includes light-emitting units E arranged in a column. One second voltage line 10 may be arranged to be electrically connected to all light-emitting units E in one device group O. Alternatively, device groups O that constitute a device group column may be all connected to the same second voltage line 10. The second voltage line 10 provides the driving voltage to at least one light-emitting unit E.

The ground line 50 is electrically connected to at least one ground pin GND of each driver chip 100. For example, the ground line 50 is electrically connected to each ground pin GND of each driver chip 100, so as to provide a ground signal for the ground pin. The ground line 50 extends along the first direction X, the ground line 50 is located outside the driver chip 100, and the ground line 50 is close to the ground pin GND. Since the ground line 50 needs to be electrically connected to the at least one ground pin GND of each driver chip 100, the ground line 50 is arranged closest to the ground pin GND, which may facilitate the electrical connection between the ground line 50 and the ground pin GND, and avoid the ground line 50 being overlapped with other signal lines.

The address signal line 20 is electrically connected to the address pin Di. An address pin Di of a first-stage driver chip in the plurality of driver chips 100 that are cascaded is electrically connected to the address signal line 20. For other driver chips that are cascaded, the relay pin Do of the former-stage driver chip is electrically connected to the address pin Di of the latter-stage driver chip through an external connection line K2. As a result, for a driver chip 100, the address pin Di can receive an address signal, and the logic control module CTR configures address information of the driver chip 100 according to the address signal, and generates a relay signal according to the received address information; the relay signal can serve as an address signal for the latter-stage driver chip 100, and the relay pin Do is capable of outputting the relay signal.

The address signal line 20 extends along the first direction X, and the address signal line 20 is located at a side of the ground line 50 away from the address pin Di. Since the address signal line 20 is electrically connected to the address pin Di of the first-stage driver chip 100, the address signal line 20 is arranged on the side relatively far away from the driver chip 100, which may facilitate the electrical connection between the ground line 50 and the ground pin GND, and avoid the address signal line 20 being overlapped with the ground line 50, thereby facilitating the single-layer wiring design for the light-emitting substrate 200.

The first voltage line 30 is electrically connected to first power supply pins V1 of the driver chips 100. The first power supply pin V1 is located at the upper edge of the driver chip. That is, first power supply pins V1 of the plurality of driver chips 100 that are cascaded are electrically connected to the first voltage line 30. The first voltage line 30 is used to provide a voltage for the driver chips 100 such that the driver chips 100 may work normally.

The test signal line 40 is electrically connected to a first functional pin Q1 of each driver chip 100. The first functional pin Q1 is located at the upper edge of the driver chip. That is, first functional pins Q1 of the plurality of driver chips 100 that are cascaded are electrically connected to the test signal line 40. The test signal line 40 is used to provide the test signal to the driver chips 100, and the test signal is used to test whether an abnormality exists in the light-emitting units E electrically connected to all driver chips 100.

With such a structure, the second voltage line 10 is located at a side of the light-emitting unit E away from the driver chip 100. The address signal line 20 and the ground line 50 are located at a side close to the ground pin GND of the driver chip 100, and the ground line 50 is located between the address signal line 20 and the driver chip 100. The first voltage line 30, the test signal line 40 and the external connection line K2 are all located between the second voltage line 10 and the ground line 50, so that the second voltage line 10, the address signal line 20, the first voltage line 30, the test signal line 40 and the grounding line 50 are not overlapped with each other. As a result, the single-layer wiring design for the light-emitting substrate 200 is achieved, the process difficulty of the light-emitting substrate 200 is reduced, and the cost is reduced.

In some embodiments, with continued reference to FIGS. 11 and 12. In the case where the driver chip 100 further includes the second functional pin Q2, the second functional pin Q2 is electrically connected to both the first functional pin Q1 of the current-stage driver chip 100 and the first functional pin Q1 of the next-stage driver chip. For example, the second functional pin Q2 may be electrically connected to the first functional pin Q1 of the next-stage driver chip through an external connection line K1.

The test signal line 40 is electrically connected to the first functional pin Q1 of the first-stage driver chip 100. Since the second functional pin Q2 is electrically connected to the first functional pin Q1 of the current-stage driver chip 100, the second functional pin Q2 and the first functional pin Q1 receive the same signal. Thus, for other driver chips that are cascaded arranged, a second functional pin Q2 of the former-stage driver chip is electrically connected to a first functional pin Q1 of the latter-stage driver chip through an external connection line K1. As a result, it facilitates the wiring design for the plurality of driver chips 100 that are cascaded in the light-emitting substrate 200.

The external connection line K1 is located between the second voltage line 10 and the ground line 50, so that the second voltage line 10, the address signal line 20, the first voltage line 30, the test signal line 40 and the ground line 50 may be not overlapped with each other. As a result, the single-layer wiring design for the light-emitting substrate 200 is achieved, the process difficulty of the light-emitting substrate 200 is reduced, and the cost is reduced.

In some embodiments, with continued reference to FIGS. 11 and 12, in the case where the driver chip 100 further includes the second power supply pin V2, the second power supply pin V2 is electrically connected to both the first power supply pin V1 of the current-stage driver chip 100 and the first power supply pin V1 of the next-stage driver chip 100.

For example, the second power supply pin V2 is electrically connected to the first power supply pin V1 of the next-stage driver chip 100 through an external connection line K3.

The first voltage line 30 is electrically connected to a first power supply pin V1 of the first-stage driver chip 100 in the plurality of driver chips 100 that are cascaded arranged. Since the second power supply pin V2 is electrically connected to the first power supply pin V1 of the current-stage driver chip 100, the first power supply pin V1 and the second power supply pin V2 of the current-stage driver chip 100 receive the same signal. Thus, for other driver chips that are cascaded arranged, a second power supply pin V2 of the former-stage driver chip may output the power supply signal to a first power supply pin V1 of the latter-stage driver chip. As a result, it facilitates the wiring design for the plurality of driver chips 100 that are cascaded in the light-emitting substrate 200.

The external connection line K3 is located between the second voltage line 10 and the ground line 50, so that the second voltage line 10, the address signal line 20, the first voltage line 30, the test signal line 40 and the ground line 50 may be not overlapped with each other. As a result, the single-layer wiring design for the light-emitting substrate 200 is achieved, the process difficulty of the light-emitting substrate 200 is reduced, and the cost is reduced.

In some embodiments, with continued reference to FIGS. 11 and 12, the address signal line 20 is configured to transmit the address signal, and the test signal line 40 is configured to transmit the test signal and driving data in the time-sharing manner.

In the embodiments, the address signal line 20 transmits the address signal to the address pin Di, and the address pin Di receives the address signal. The logic control module CTR configures the address information of the driver chip 100 according to the address signal, and generates the relay signal. The relay signal can serve as the address signal for the next-stage driver chip 100. The relay pin Do is electrically connected to the logic control module CTR, and the relay pin Do is capable of outputting the relay signal.

For example, the address signal may be a digital signal. After a driver chip 100 receives the address signal, the driver chip 100 may analyze, obtain and store the address information in the address signal, and may further increase the address signal by 1 or another fixed amount, and modulate the incremented address signal (a new address signal) into the relay signal. The relay signal serves as the address signal for the next-stage driver chip 100. Of course, the driver chip 100 may also adopt another different function to generate the new address signal.

The test signal line 40 transmits the test signal and the driving data in the time-sharing manner. The test signal line 40 may provide different signals to a same pin (the first functional pin Q1) of the driver chip 100.

When the test signal line 40 provides the test signal to the first functional pin Q1, the first functional pin Q1 receives the test signal; the test signal includes the test data and first general address information. The first general address information is capable of matching initialization address information of any one driver chip, so that a logic control module of any one driver chip 100 generates, according to the test data, the test current flowing through each output pin OUT. The light-emitting unit E receives the test current to emit light. Therefore, the lighting test for the light-emitting units E electrically connected to the driver chips 100 may be achieved through one detection operation. As a result, the repairing efficiency of the driver chips 100 is effectively improved.

When the test signal line 40 provides the driving data to the first functional pin Q1, the first functional pin Q1 may further be used to receive the driving data. The driving data includes driving information and address verification information. The driving data includes a plurality of pieces of address verification information and a plurality of pieces of driving information corresponding to the plurality of pieces of address verification information. For any one driver chip, when a piece of address verification information matches the address information, the driver chip receives a corresponding piece of driving information according to the address verification information, and generate the driving current corresponding to at least one output pin OUT according to the received driving information. That is, the driver chip 100 generates the driving current(s) corresponding to the at least one light-emitting unit E connected thereto, and controls at least one output pin OUT thereof to form electrical path(s) with corresponding light-emitting unit(s) E. The driving current(s) flow in the electrical path(s). If starting from a certain driver chip 100, light-emitting units E electrically connected to subsequent driver chips 100 that are cascaded arranged do not emit light, it is determined that an address pin Di of the start driver chip 100 is poorly soldered and needs to be repaired.

With such a structure, there is no need to provide a separate signal line and a separate data pin for providing the driving data to the driver chip 100, which reduces the number of signal lines connected to the driver chip 100. As a result, it facilitates the single-layer wiring design for the light-emitting substrate 200, reduces the process difficulty of the light-emitting substrate 200, and reduces the cost.

In some embodiments, with continued reference to FIG. 11, in the case where the address signal line 20 is configured to transmit the driving data, the address signal line 20 and the second voltage line 10 use different signal lines, which may simplify circuit structures in the driver chip 100, and there is no need to provide a power regulation circuit (the power regulation circuit being used to generate the driving voltage based on a direct current component in the power supply signal and generate the driving data based on a modulation component in the power supply signal) in the driver chip 100. As a result, it helps reduce an area of the driver chip 100. In addition, with such an arrangement, an external circuit structure may also be simplified, and it may not only avoid providing a modulation circuit that modulates the driving voltage and the driving data into power line carrier communication, but also reduce the quality requirements for the driving voltage.

In some embodiments, referring to FIGS. 11 and 12, the address signal line 20 is configured to transmit the driving data, and the test signal line 40 is configured to transmit the test signal.

In the embodiments, the test signal line 40 transmits the test signal to the first functional pin Q1, the test signal received by the first functional pin Q1 of the driver chip 100 includes a switch signal, and the switch signal is used to control the logic control module CTR to generate the test current flowing through each output pin OUT. In this case, it may be possible to control light-emitting units E electrically connected to the driver chip 100 to receive the test current. In addition, the second functional pin Q2 is capable of outputting the test signal to the next-stage driver chip 100.

Thus, the lighting test for the light-emitting units E electrically connected to the driver chips 100 may be achieved through one detection operation. If a light-emitting unit E does not emit light, it may be determined that the light-emitting unit E has a problem. As a result, the repairing efficiency of the driver chip 100 is effectively improved. In some examples, the test signal may be a high-level signal or a low-level signal, as long as the logic control module CTR may be controlled by the test signal to generate the test current flowing through each output pin OUT.

The address signal line 20 transmits the driving data to the address pin Di. The address pin Di receives the driving data, and the driving data includes the address verification information and a plurality of pieces of driving information corresponding to the plurality of driver chips that are cascaded. The logic control module CTR obtains, according to the address verification information, a piece of driving information corresponding to the current-stage driver chip, updates the address verification information, and generates driving data including updated address verification information. The relay pin Do is electrically connected to the logic control module, and the relay pin Do is capable of outputting the driving data including the updated address verification information to the next-stage driver chip 100.

It will be understood that, the address pin Di of the former-stage driver chip 101 is capable of receiving the driving data, and the driving data includes address verification information of the former-stage driver chip 101 and the plurality of pieces of driving information corresponding to all the driver chips that are cascaded. The logic control module CTR of the former-stage driver chip 101 receives the driving data, and obtains, according to the address verification information in the driving data, the piece of driving information corresponding to the address verification information of the former-stage driver chip 101. The logic control module CTR generates, according to the piece of driving information, the driving current(s) corresponding to the at least one light-emitting unit E connected to the driver chip 100, and controls at least one output pin OUT of the driver chip 100 to form electrical path(s) with corresponding light-emitting unit(s) E. The driving current(s) may flow in the electrical path(s). If starting from a certain driver chip 100, light-emitting units E electrically connected to subsequent driver chips 100 that are cascaded arranged do not emit light, it is determined that the address pin Di of the start driver chip 100 is poorly soldered and needs to be repaired.

In addition, the logic control module CTR of the former-stage driver chip 101 updates the address verification information to generate the driving data. The driving data includes the updated address verification information. The relay pin Do is capable of outputting the updated address verification information to the latter-stage driver chip 102.

For example, the logic control module CTR further updates the received driving data. That is, the logic control module CTR further updates the address verification information in the driving data. The address verification information in the driving data includes the number of start identification bits and/or the number of end identification bits. The number of start identification bits in the driving data is reduced by 1 and/or the number of end identification bits is increased by 1; and then the re-edited driving data is output to an address pin Di of the next-stage driver chip through the relay pin Do of the current-stage driver chip. Of course, the driver chip 100 may also adopt another different function to generate new address verification information.

With such a structure, for the light-emitting substrate 200, the driving data may be transmitted through the address signal line 20, and the driving data includes the address verification information and the plurality of pieces of driving information corresponding to the plurality of driver chips that are cascaded. That is, the address signal line 20 may achieve functions of both writing address and inputting driving information. Compared with a manner in which an address signal line is used to write data and a data signal line is used to achieve the function of inputting the driving information, the number of signal lines connected to the driver chip 100 is reduced, thereby facilitating the single-layer wiring design for the light-emitting substrate 200, reducing the process difficulty of the light-emitting substrate 200, and reducing the cost.

In some embodiments, with continued reference to FIG. 11, in the case where the test signal line 40 is configured to transmit the test signal and the driving data in the time-sharing manner, the test signal line 40 and the second voltage line 10 use different signal lines, which may simplify the circuit structures in the driver chip 100, and there is no need to provide the power regulation circuit (the power regulation circuit being used to generate the driving voltage based on the direct current component in the power supply signal and generate the driving data based on the modulation component in the power supply signal) in the driver chip 100. As a result, it helps reduce the area of the driver chip 100. In addition, with such an arrangement, the external circuit structure may also be simplified, and it may not only avoid providing the modulation circuit that modulates the driving voltage and the driving data into power line carrier communication, but also reduce the quality requirements for the driving voltage.

In some embodiments, referring to FIG. 11, the light-emitting substrate 200 further includes a feedback signal line 70, and the feedback signal line 70 is electrically connected to a relay pin Do of a last driver chip 100 in the driver chips 100 that are cascaded arranged. The feedback signal line 70 is close to the ground line 50 and located between the ground line 50 and the test signal line 40, so as to prevent the feedback signal line 70 from being overlapped with other signal lines (such as the ground line 50 and the test signal line 40). As a result, it facilitates the single-layer wiring design for the light-emitting substrate 200, reduces the process difficulty of the light-emitting substrate 200, and reduces the cost.

Figure 13:
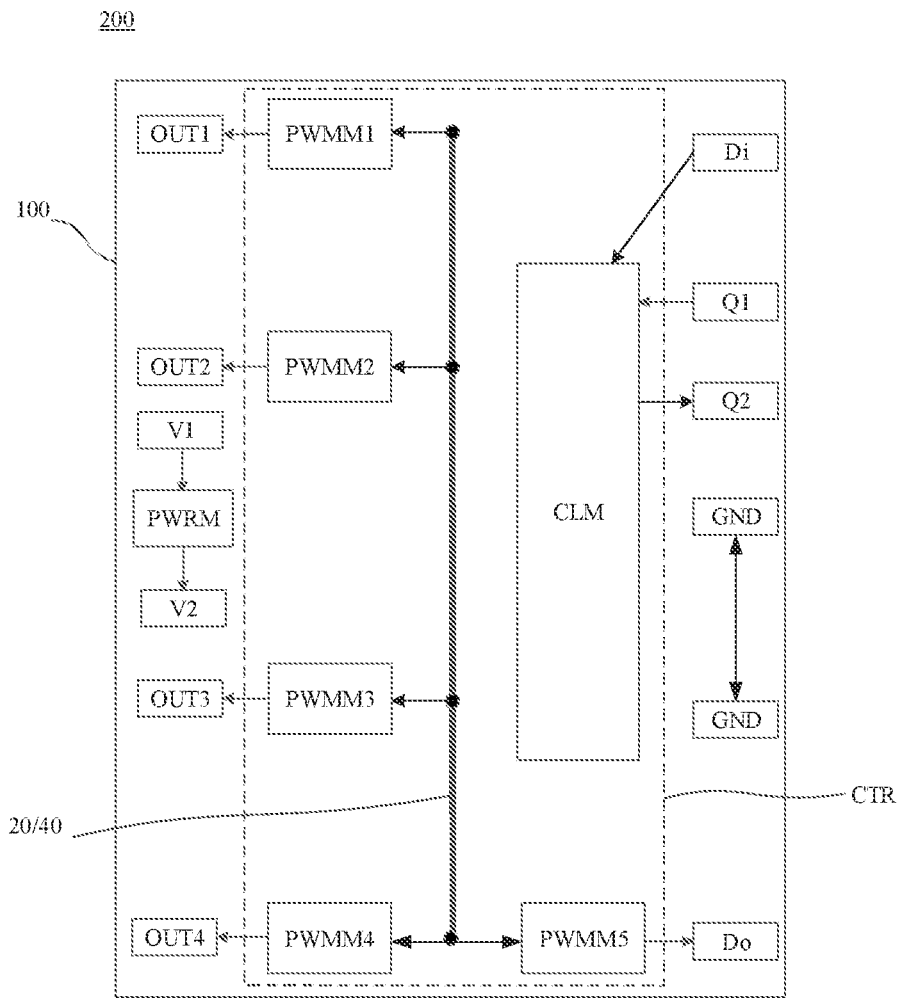
FIG. 13 is a circuit block diagram of a light-emitting substrate provided in some embodiments of the present disclosure.

FIG. 13 is a circuit block diagram of the light-emitting substrate provided in some embodiments of the present disclosure.

In some embodiments, as shown in FIG. 13, the driver chip 100 includes the address pin Di, the relay pin Do, the first functional pin Q1, the second functional pin Q2, ground pins GND, the first power supply pin V1 and the second power supply pin V2.

The driver chip 100 further includes four output pins OUT, and the four output pins OUT are a first output pin OUT1, a second output pin OUT2, a third output pin OUT3 and a fourth output pin OUT4.

The logic control module CTR includes four modulation modules, and the four modulation modules are a first modulation module PWMM1, a second modulation module PWMM2, a third modulation module PWMM3 and a fourth modulation module PWMM4. The logic control module CTR further includes a control unit CLM.

The first output pin OUT1 to the fourth output pin OUT4 are connected to the first modulation module PWMM1 to the fourth modulation module PWMM4 in a one-to-one correspondence. The control unit CLM is used to generate a first driving control signal, a second driving control signal, a third driving control signal and a fourth driving control signal according to the driving data, and transmit the first driving control signal, the second driving control signal, the third driving control signal and the fourth driving control signal to the first modulation module PWMM1, the second modulation module PWMM2, the third modulation module PWMM3 and the fourth modulation module PWMM4, respectively.

The first modulation module PWMM1 is electrically connected to the first output pin OUT1, and can be turned on or off under control of the first driving control signal, thereby controlling the first output pin OUT1 and the ground line 50 that is electrically connected to the ground pins GND to be connected or not.

When the first modulation module PWMM1 is turned on, the ground line 50 (as shown in FIG. 11), the first output pin OUT1, a light-emitting unit E (as shown in FIG. 11) electrically connected to the first output pin OUT1 and the second voltage line 10 (as shown in FIG. 11) together form a signal loop, and thus the light-emitting unit E works; when the first modulation module PWMM1 is turned off, the signal loop is disconnected, and thus the light-emitting unit E does not work.

In this way, the first modulation module PWMM1 may perform, under control of the first driving control signal, phase modulation on a driving current flowing through the light-emitting unit E, and the first driving control signal is a pulse width modulation signal. The first modulation module PWMM1 may modulate, according to the first driving control signal, a duration of the driving current flowing through the light-emitting unit E, and thus control a working state of the light-emitting unit E. When the light-emitting unit E includes an LED, by increasing a duty ratio of the first driving control signal, it may be possible to increase a total light-emitting duration of the LED in a display frame, thereby increasing the total light-emitting luminance of the LED in the display frame. As a result, the luminance in the region of the light-emitting substrate 200 increases. On the contrary, by reducing a duty ratio of the pulse width modulation signal, it may be possible to reduce the total light-emitting duration of the LED in the display frame, thereby reducing the total light-emitting luminance of the LED in the display frame. As a result, the luminance in the region of the light-emitting substrate decreases.

Correspondingly, the second modulation module PWMM2 is electrically connected to the second output pin OUT2, and can be turned on or off under control of the second driving control signal; the second driving control signal is a pulse width modulation signal. The third modulation module PWMM3 is electrically connected to the third output pin OUT3, and can be turned on or off under control of the third driving control signal; the third driving control signal is a pulse width modulation signal. The fourth modulation module PWMM4 is electrically connected to the fourth output pin OUT4, and can be turned on or off under control of the fourth driving control signal; the fourth driving control signal is a pulse width modulation signal.

In some embodiments, the first modulation module PWMM1 to the fourth modulation module PWMM4 may be switch elements. For example, the switch element may be a transistor such as a metal-oxide semiconductor (MOS) field effect transistor or a thin film transistor (TFT). The first driving control signal to the fourth driving control signal may each be a pulse width modulation signal. A switch element is turned on or off under control of a pulse width modulation signal.

In some embodiments, with continued reference to FIG. 13, in a case where the address signal line 20 is configured to transmit the address signal and the driving data in the time-sharing manner, the first modulation module PWMM1 to the fourth modulation module PWMM4 may be electrically connected to the control unit CLM through an address signal line 20, or may be electrically connected to the control unit CLM through respective address signal lines 20, or may be electrically connected to the control module CLM in another manner. In the case where the test signal line 40 is configured to transmit the test signal and the driving data in the time-sharing manner, the first modulation module PWMM1 to the fourth modulation module PWMM4 may be electrically connected to the control unit CLM through a test signal line 40, or may be electrically connected to the control unit CLM through respective test signal lines 40, or may be electrically connected to the control unit CLM in another manner. It is not specially limited in the embodiments of the present disclosure.

In some embodiments, with continued reference to FIG. 13, the logic control module CTR may further include a fifth modulation module PWMM5, and the fifth modulation module PWMM5 is electrically connected to the relay pin Do. In the case where the address pin Di receives the address signal, the control unit CLM may receive the address signal from the address pin Di, generate a relay control signal according to the address signal, and transmit the relay control signal to the fifth modulation module PWMM5. The fifth modulation module PWMM5 may generate a relay signal in response to the relay control signal, and loads the relay signal to the relay pin Do.

In the embodiments, the fifth modulation module PWMM5 may be electrically connected to the control unit CLM through the test signal line 40 or the address signal line 20, or may be electrically connected to the control unit CLM through a dedicated data line, or may be electrically connected to the control unit CLM in another manner. It is not specifically limited in the embodiments of the present disclosure.

In some embodiments, with continued reference to FIG. 13, in the case where the address signal line 20 is configured to transmit the address signal and the driving data in the time-sharing manner, the first modulation module PWMM1 to the fifth modulation module PWMM5 and the control unit CLM are all connected to the address signal line 20, and thus the address signal line 20 interacts with the first modulation module PWMM1 to the fifth modulation module PWMM5. In the case where the test signal line 40 is configured to transmit the test signal and the driving data in the time-sharing manner, the first modulation module PWMM1 to the fifth modulation module PWMM5 and the control unit CLM are all connected to the test signal line 40, and thus the test signal line 40 interact with the first modulation module PWMM1 to the fifth modulation module PWMM5.

In some examples, the fifth modulation module PWMM5 may include a switch element. For example, the switch element may be a transistor such as a metal-oxide semiconductor (MOS) field effect transistor or a thin film transistor (TFT). The relay control signal may be a pulse width modulation signal, and the switch element is turned on or off under control of the pulse width modulation signal. When the switch element is turned on, the fifth modulation module PWMM5 may output a current or a voltage. For example, the fifth modulation module PWMM5 generates a pulse width modulation signal that serves as the relay signal, and the relay signal is output through the relay pin Do. When the switch element is turned off, the fifth modulation module PWMM5 does not output any electrical signal (a current or a voltage).

In some embodiments, the logic control module CTR may further include a power supply module PWRM, the first power supply pin V1 may load the power supply signal to the power supply module PWRM, and the power supply module is configured to distribute power to circuits in the driver chip 100, so as to ensure the power supply for the driver chip 100. The second power supply pin V2 may also be electrically connected to the power supply module PWRM, and the second power supply pin V2 is used for outputting the power supply signal to the next-stage driver chip 100.

Figure 14:
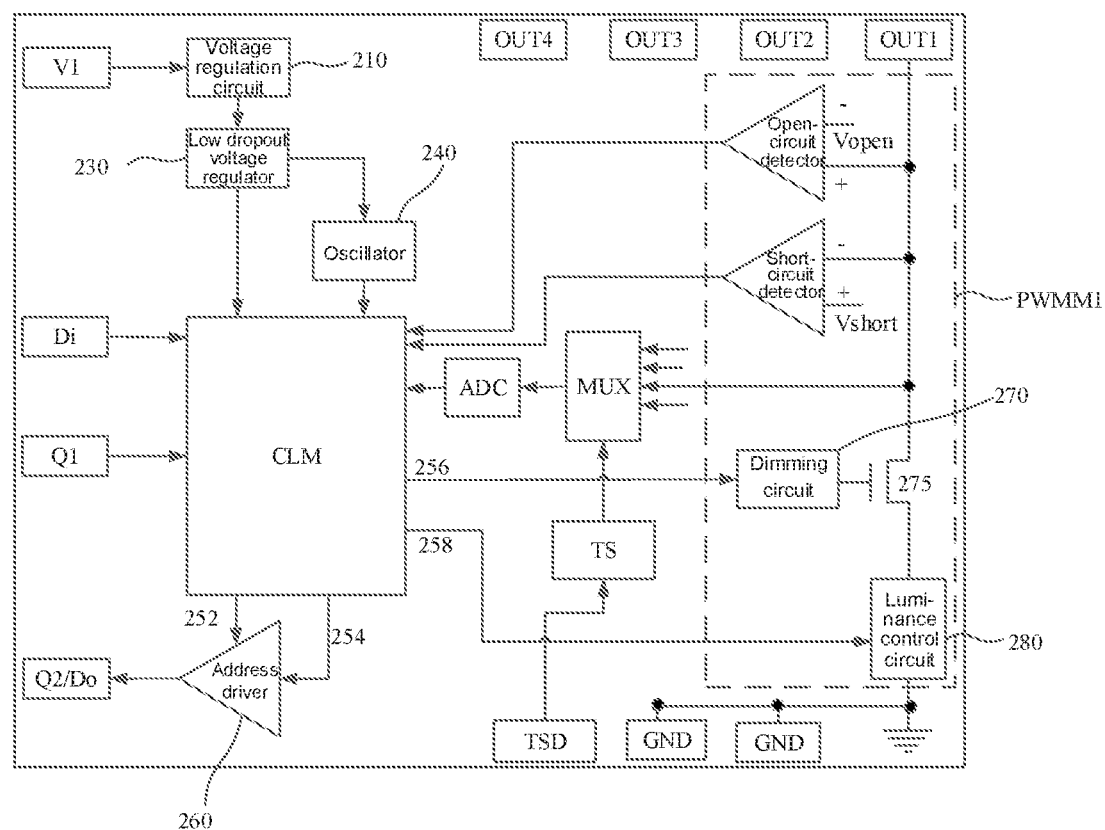
FIG. 14 is a circuit block diagram of a driver chip in FIG. 13.

FIG. 14 is a circuit block diagram of the driver chip in FIG. 13. In some embodiments, only the first modulation module PWMM1 is shown and other modulation modules are not shown. Referring to FIG. 14, in the examples, the driver chip 100 may include a voltage regulation circuit 210, a low dropout voltage regulator 230, an oscillator 240, the control unit CLM, an address driver 260, a dimming circuit 270, transistor(s) 275 and a luminance control circuit 280. In various implementations, the driver chip 100 may include additional, fewer or different components.

The voltage regulation circuit 210 processes the power supply signal received at the first power supply pin V1 to obtain the direct current component in the power supply signal, so as to generate a power supply voltage. In an implementation, the voltage regulation circuit 210 includes a first-order resistor-capacitor (RC) filter followed by an active follower. The power supply voltage is provided to the low dropout voltage regulator 230. The low dropout voltage regulator 230 converts the power supply voltage into a stable direct current voltage (a voltage of which may step down) for powering the oscillator 240, the control unit CLM and other components (not shown). In an implementation, the stable direct current voltage may be 1.8 volts. The oscillator 240 provides a clock signal, and a maximum frequency of the clock signal may be, for example, about 10 MHz.

The control unit CLM receives the test signal from the first functional pin Q1, and the test signal includes the test data and the first general address information. The first general address information may match the initialization address information of any one driver chip 100, and thus the test current flowing through each output pin OUT is generated. The light-emitting unit E receives the test current to emit light. The control unit CLM receives the test signal from the first functional pin Q1, and provides the first general address information in the test signal to the address driver 260. The address driver 260 caches the first general address information into the second functional pin Q2, and provides the test signal to the next-stage driver chip 100.

The control unit CLM receives the driving data from a data pin (the first functional pin Q1), the direct voltage from the low dropout voltage regulator 230 and a clock signal from the oscillator 240. Depending on a working phase of the light-emitting substrate, the control unit CLM may further receive digital data in the address signal received at the address pin Di; the control unit CLM may output an enable signal 252, an incremented data signal 254, a PWM clock select signal 256 and a maximum current signal 258. The control unit CLM activates the enable signal 252 to enable the address driver 260. The control unit CLM receives the address signal through the address pin Di, stores the address, and provides the incremented data signal 254 representing the outgoing address to the address driver 260. In the case where the enable signal 252 is activated during the address configuration phase, the address driver 260 buffers the incremented data signal 254 into the relay pin Do. The control unit CLM may control the dimming circuit 270 to turn off the transistor 275, so as to effectively turn off the current path of the light-emitting unit.

The control unit CLM can further deactivate the enable signal 252, and the output of the address driver 260 is tri-stated to effectively decouple the enable signal 252 from the relay pin Do. The PWM clock select signal 256 specifies a duty ratio for controlling PWM dimming by PWM dimming circuit 270. Based on a selected duty ratio, the PWM dimming circuit 270 controls timings of a turned-on state and a turned-off state of transistor 275. During the turned-on state of transistor 275, a current path is established from an output pin OUT (which is coupled to a light-emitting unit, e.g., OUT1 in FIG. 14) to a ground pin GND and passing through the transistor 275, and the luminance control circuit 280 collects driving currents passing through the light-emitting units. During the turned-off state of transistor 275, current paths are open, so as to prevent the currents from flowing through the light-emitting units. When the transistor 275 is in the turned-on state, the luminance control circuit 280 receives the maximum current signal 258 from the control unit CLM and controls a magnitude of a current flowing through a light-emitting unit (from the output pin OUT to the ground pin GND). The control unit CLM controls the duty ratio of the PWM dimming circuit 270 and the maximum current signal 258 in the luminance control circuit 280, so as to set the luminance of an LED of the light-emitting unit to be the desired luminance.

It will be understood that, the driver chip 100 may further include a voltage-controlled constant current circuit (not shown in the figure), and an input reference voltage and an input reference current of the voltage-controlled constant current circuit may be generated through the power supply signal received at the first power supply pin V1. The voltage-controlled constant current circuit may be electrically connected to the luminance control circuit 280.

In some embodiments, with continued reference to FIG. 14, a short-circuit detector and an open-circuit detector are provided in the modulation module. The open-circuit detector is composed of an operational amplifier connected in a virtual open mode, and is used to detect whether an open circuit occurs between the light-emitting unit and the driver chip 100; an Vopen terminal may be a floating signal terminal. The short-circuit detector is composed of an operational amplifier connected in a virtual short mode, and is used to detect whether a short circuit occurs between the light-emitting unit and the driver chip 100; a level at a Vshort terminal may be the same as a level of the driving data transmitted by the second voltage line 10.

In some embodiments, with continued reference to FIG. 14, the driver chip 100 further includes a data selector MUX and an analog-to-digital converter ADC. In the case where signal loops are formed between the plurality of output pins OUT of the driver chip 100, respective connected light-emitting unit and the second voltage line 10, electrical signals on the signal loops may be transmitted to the data selector MUX, be processed by the analog-to-digital converter ADC in the time-sharing manner, and then be transmitted to the control unit CLM; next, the signal (for example, electrical signals of the signal loops are appended to the data signal 254 according to a sequence and a coding rule) in the control unit CLM is transmitted step by step through relay pins Do of the driver chips 100, until the signal is output from the relay pin Do of the last-stage driver chip 100. The driver chip 100 is connected to the external circuit through the feedback signal line 70. The external circuit may respond to feedback information and adjust a level of a signal output by the external circuit, thereby reducing the power consumption of the light-emitting substrate.

In some embodiments, with continued reference to FIG. 14, the driver chip 100 may also be provided with a thermal shutdown delay sensor TSD and a thermal shutdown delay controller TS. The thermal shutdown delay sensor TSD is used to detect an internal temperature of the driver chip 100. In a case where an internal temperature of the driver chip 100 reaches a preset protection temperature (which is generally set between 150° C. and 170° C., inclusive), the thermal shutdown delay controller TS works to shut down the outputting of the driver chip 100, so as to reduce the power consumption of the driver chip 100, thereby reducing the internal temperature of the driver chip 100. In a case where the internal temperature of the driver chip 100 drops to a preset restart temperature (the restart temperature being equal to a difference between the protection temperature and a delay temperature), the driver chip 100 resumes outputting. The delay temperature is generally set in a range of 15° C. to 30° C., inclusive. The thermal shutdown delay controller TS may be connected to the data selector MUX, so as to feed back abnormal information to the control unit CLM through the data selector MUX, thereby controlling the working state of the driver chip 100.

Figure 15:
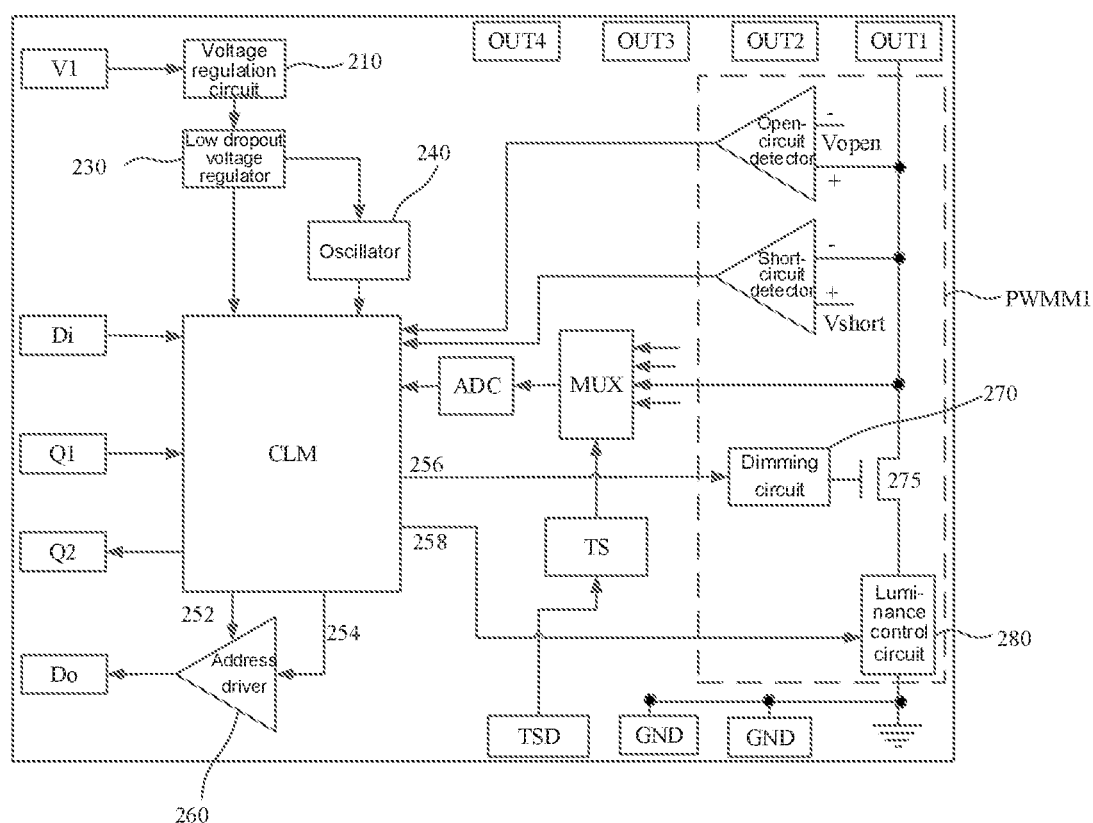
FIG. 15 is another circuit block diagram of a driver chip in FIG. 13.

FIG. 15 is another circuit block diagram of the driver chip in FIG. 13. In yet other embodiments, referring to FIG. 15, the control unit CLM receives the test signal from the first functional pin Q1, and the test signal includes the switch signal. The switch signal is used to control the control unit CLM to generate the test current flowing through each output pin OUT. The light-emitting unit E receives the test current to emit light. In addition, the control unit CLM receives the test signal through the first functional pin Q1 and sends the test signal to the second functional pin Q2, and the second functional pin Q2 is capable of outputting the test signal to the next-stage driver chip 100.

The control unit CLM receives the driving data from the data pin (or the address pin Di), the direct voltage from the low dropout voltage regulator 230 and the clock signal from the oscillator 240. Depending on the working phase of the light-emitting substrate, the control unit CLM may further receive the digital data from the address signal received at the address pin Di; the control unit CLM may output the enable signal 252, the incremented data signal 254, the PWM clock select signal 256 and the maximum current signal 258. The control unit CLM activates the enable signal 252 to enable the address driver 260. The control unit CLM receives the address signal through the address pin Di, stores the address, and provides the incremented data signal 254 representing the outgoing address to the address driver 260. In the case where the enable signal 252 is activated during the address configuration phase, the address driver 260 buffers the incremented data signal 254 into the relay pin Do. The control unit CLM may control the dimming circuit 270 to turn off the transistor 275, so as to effectively turn off the current path of the light-emitting unit.

Figure 16:
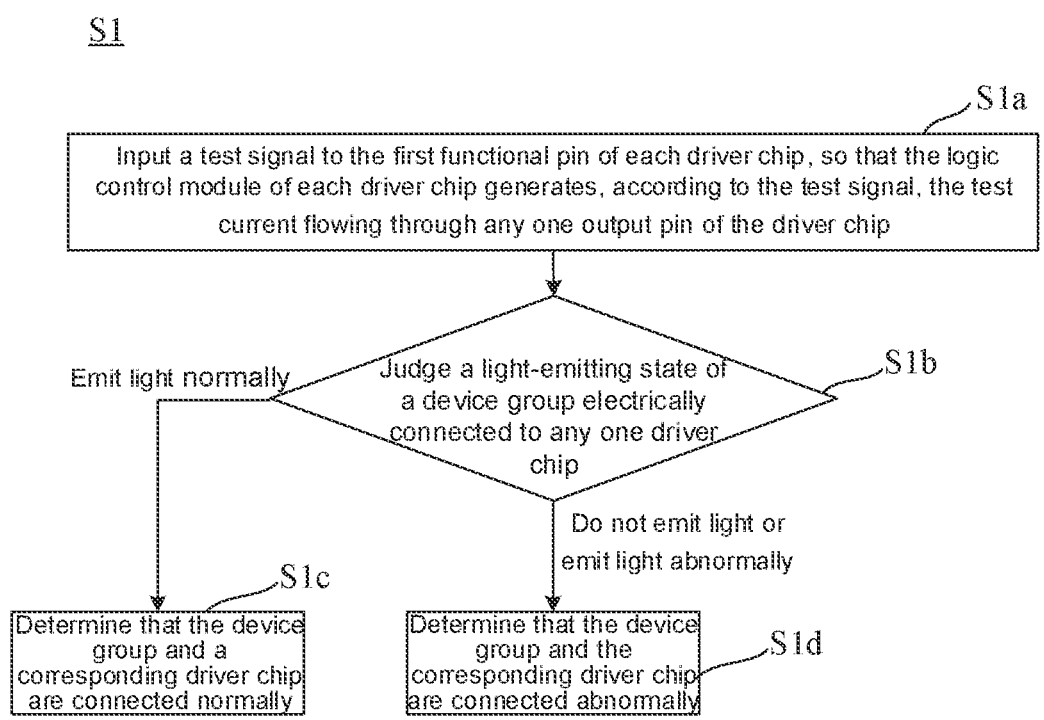
FIG. 16 is a flowchart of a detecting method of a display substrate provided in some embodiments of the present disclosure.

FIG. 16 is a flowchart of a detecting method of the light-emitting substrate provided in some embodiments of the present disclosure. Some embodiments of the present disclosure provide a testing method of the light-emitting substrate 200. The light-emitting substrate 200 is the light-emitting substrate 200 described in any one of the embodiments above. The device group O includes at least one light-emitting unit E. Referring to FIG. 16, the testing method includes following steps.

In S1, a test signal is input to a first functional pin of each driver chip, so that a logic control module of each driver chip generates, according to the test signal, a test current flowing through each output pin of the driver chip. A light-emitting state of a device group electrically connected to any one driver chip is determined. If the device group emits light normally, it is determined that the device group and a corresponding driver chip are normally connected; and if the device group does not emit light or emits light abnormally, it is determined that the device group and the corresponding driver chip are abnormally connected.

As for S1,
in S1a, the test signal is input to the first functional pin Q1 of each driver chip 100, so that the logic control module of each driver chip generates, according to the test signal, the test current flowing through each output pin.

The test current may drive the light-emitting unit E in the device group O to emit light.

In S1b, the light-emitting state of the device group O electrically connected to any one driver chip 100 is determined.

A connection condition of a light-emitting unit E may be determined according to the light-emitting state of the light-emitting unit E in the device group O. The light-emitting state may include emitting light normally, emitting light abnormally and not emitting light.

If the device group O emits light normally, S1c is performed. In S1c, it is determined that the device group O and the corresponding driver chip 100 are connected normally. If the light-emitting unit E in the device group O emits light normally, the light-emitting unit E and the corresponding driver chip 100 are connected normally. It will be seen that the device group O or the light-emitting unit E does not need to be repaired.

The light-emitting unit E emitting light normally means that the light-emitting luminance of the light-emitting unit E reaches threshold luminance. The threshold luminance may be specifically set according to actual situations.

If the device group O does not emit light or emits light abnormally, S1d is performed. In S1d, it is determined that the device group O and the corresponding driver chip 100 are connected abnormally. If the light-emitting unit E in the device group O does not emit light or emits light abnormally, it is determined that the light-emitting unit E and the corresponding driver chip 100 are connected abnormally.

For example, if the device group O or the light-emitting unit E does not emit light, it may be determined that the device group O or the light-emitting unit E is disconnected from the driver chip that has been connected thereto, and the device group O or the light-emitting unit E needs to be repaired and re-soldered, so that the device group O or the light-emitting unit E may be connected to the driver chip normally and emit light normally.

For example, if the device group O or the light-emitting unit E emits light abnormally, it may be determined that the device group O or the light-emitting unit E may be poorly soldered, and the device group O or the light-emitting unit E needs to be repaired and re-soldered, so that the device group O or the light-emitting unit E may be connected to the driver chip normally and emit light normally.

The light-emitting unit E emitting light abnormally means that the light-emitting luminance of the light-emitting unit E is lower than the threshold luminance, and the threshold luminance may be specifically set according to actual situations.

In the testing method above, the test signal is input to the first functional pin Q1 of each driver chip 100, so that a lighting test for light-emitting units E electrically connected to the driver chips 100 may be achieved through one detection operation. As a result, the repairing efficiency of the driver chips 100 is improved.

Figure 17:
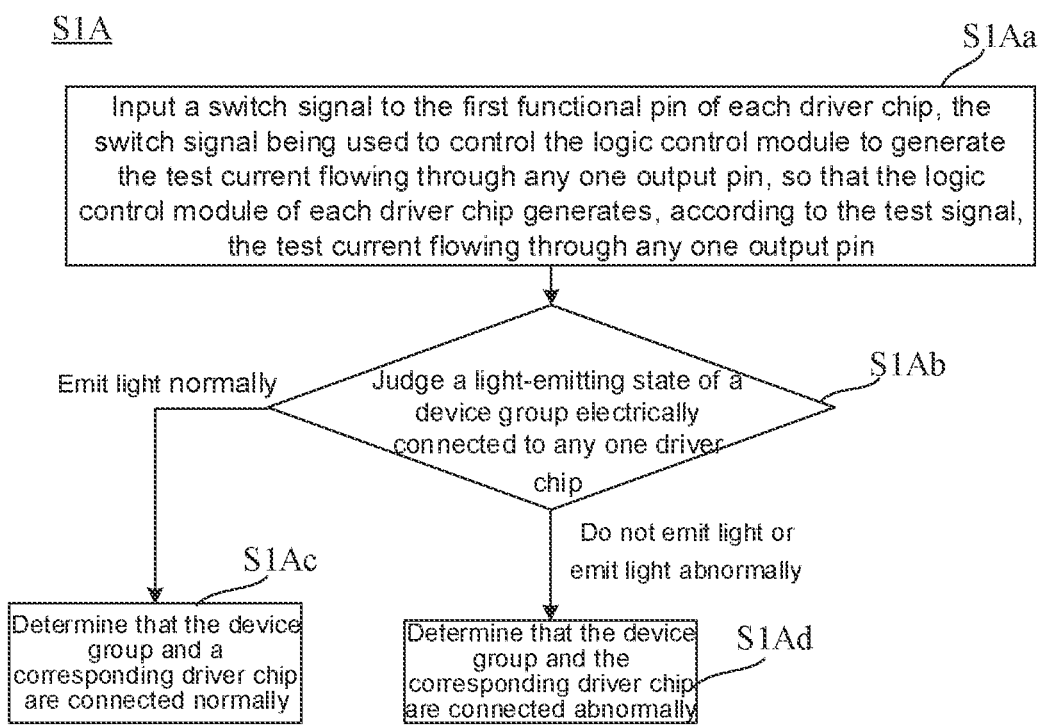
FIG. 17 is a flowchart of a detecting method of a display substrate provided in some other embodiments of the present disclosure.

FIG. 17 is a flowchart of the detecting method of the light-emitting substrate provided in some other embodiments of the present disclosure.

In some embodiments, referring to FIG. 17 and in combination with FIG. 12, S1A includes following steps.

In S1Aa, a switch signal is input to the first functional pin of each driver chip, the switch signal being used to control the logic control module to generate the test current flowing through each output pin, so that the logic control module of each driver chip generates, according to the test signal, the test current flowing through each output pin.

In S1Ab, the light-emitting state of the device group O electrically connected to any one driver chip 100 is determined.

If the device group O emits light normally, S1Ac is performed. In S1Ac, it is determined that the device group O and the corresponding driver chip 100 are connected normally. If the light-emitting unit E in the device group O emits light normally, the light-emitting unit E and the corresponding driver chip 100 are connected normally. It will be seen that the device group O or the light-emitting unit E does not need to be repaired.

If the device group O does not emit light or emits light abnormally, S1Ad is performed. In S1Ad, it is determined that the device group O and the corresponding driver chip 100 are connected abnormally. If the light-emitting unit E in the device group O does not emit light or emits light abnormally, it is determined that the light-emitting unit E and the corresponding driver chip 100 are connected abnormally.

In the testing method above, the test signal is input to the first functional pin Q1 of each driver chip 100, so that the lighting test for the light-emitting units E electrically connected to the driver chips 100 may be achieved through one detection operation. As a result, it helps improve the repairing efficiency of the driver chips 100.

In the embodiments, the test signal includes the switch signal, and the switch signal is used to control the logic control module CTR to generate the test current flowing through each output pin OUT. That is, all light-emitting units E electrically connected to the driver chip 100 may be controlled to receive the test current. In addition, since the second functional pin Q2 is directly connected to the first functional pin Q1 of the current-stage driver chip and the first functional pin Q1 of the next-stage driver chip, the driver chip 100 in each stage may receive the same test signal. Thus, the lighting test for the light-emitting units E electrically connected to the driver chips 100 may be achieved through one detection operation. If a light-emitting unit E does not emit light, it may be determined that the light-emitting unit E has a problem, which effectively improves the repairing efficiency of the driver chips 100. In some examples, the test signal may be a high-level signal or a low-level signal, as long as the test signal may be used to control the logic control module CTR to generate the test current flowing through each output pin OUT.

Figure 18:
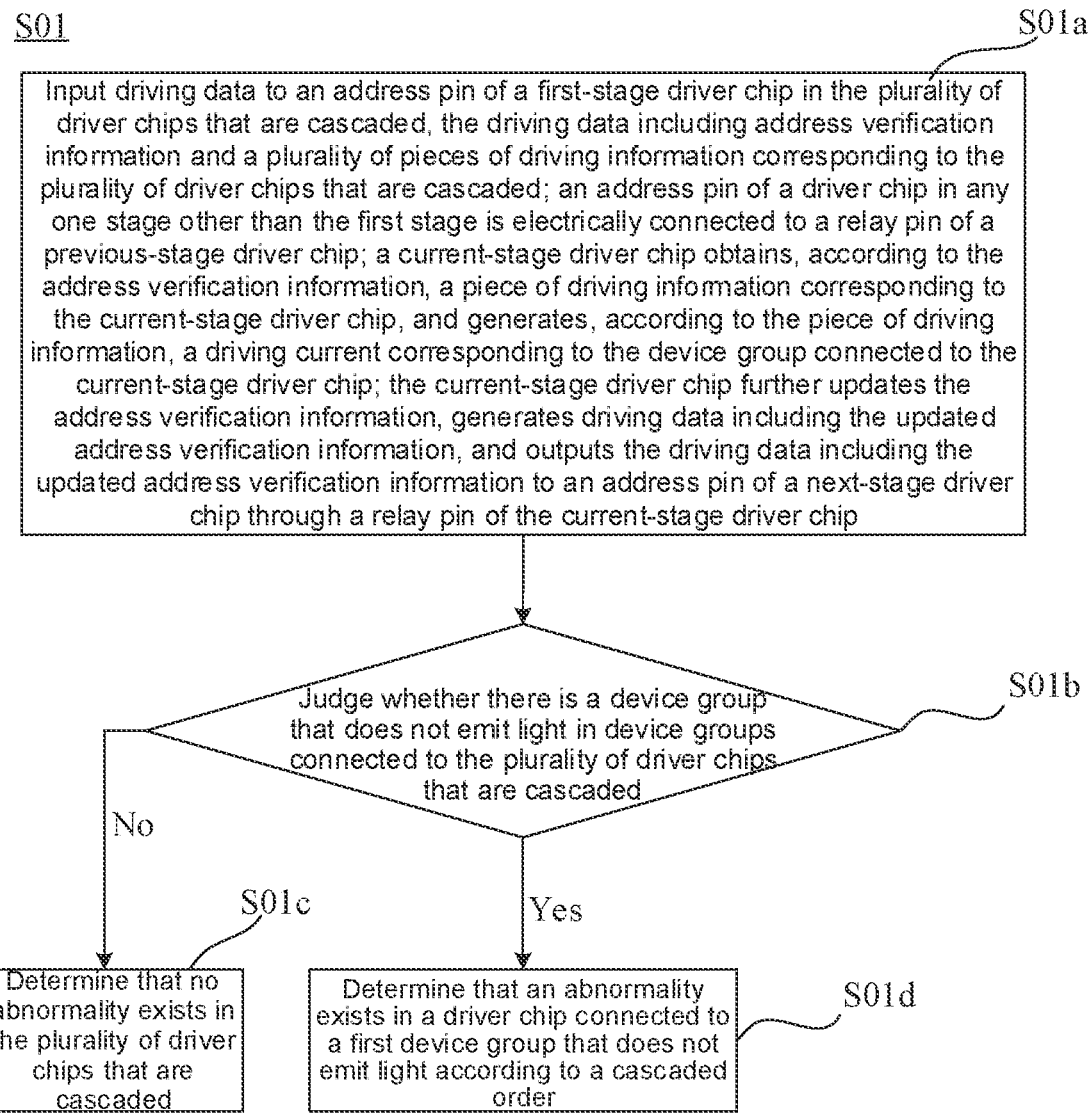
FIG. 18 is a flowchart of a detecting method of a display substrate provided in yet other embodiments of the present disclosure.

FIG. 18 is a flowchart of the detecting method of the light-emitting substrate provided in yet other embodiments of the present disclosure.

In some embodiments, referring to FIG. 18 and in combination with FIG. 12, the testing method further includes following steps.

In S01, driving data is input to an address pin of a first-stage driver chip in the plurality of driver chips that are cascaded. The driving data includes address verification information and a plurality of pieces of driving information corresponding to the plurality of driver chips that are cascaded. An address pin of a driver chip in any one stage other than the first stage is electrically connected to a relay pin of a previous-stage driver chip. A current-stage driver chip obtains, according to the address verification information, a piece of driving information corresponding to the current-stage driver chip, and generates, according to the piece of driving information, a driving current corresponding to the device group connected to the current-stage driver chip. The current-stage driver chip further updates the address verification information, generates driving data including the updated address verification information, and outputs the driving data including the updated address verification information to an address pin of a next-stage driver chip through a relay pin of the current-stage driver chip. It is determined whether there is a device group that does not emit light in device groups connected to the plurality of driver chips that are cascaded. If there is the device group that does not emit light, it is determined that an abnormality exists in a driver chip connected to a first device group that does not emit light according to the cascaded sequence. If there is no device group that does not emit light, it is determined that no abnormality exists in the plurality of driver chips that are cascaded.

As for S01, in S01a, the driving data is input to the address pin Di of the first-stage driver chip in the plurality of driver chips that are cascaded. The driving data includes the address verification information and the plurality of pieces of driving information corresponding to the plurality of driver chips that are cascaded. The address pin Di of a driver chip 100 in any one stage other than the first stage is electrically connected to the relay pin Do of the previous-stage driver chip. The current-stage driver chip 100 obtains, according to the address verification information, the piece of driving information corresponding to the current-stage driver chip 100, and generates, according to the driving information, the driving current corresponding to the device group O connected to the current-stage driver chip 100; the current-stage driver chip 100 further updates the address verification information, generates the driving data including the updated address verification information, and outputs the driving data including the updated address verification information to the address pin Di of the next-stage driver chip 100 through the relay pin Do of the current-stage driver chip 100.

In S01b, it is determined whether there is a device group O that does not emit light in the device groups O connected to the plurality of driver chips 100 that are cascaded.

If there is no device group that does not emit light, S01c is performed. In S01c, it is determined that no abnormality exists in the plurality of driver chips 100 that are cascaded, and there is no need to repair the driver chips 100.

If there is the device group that does not emit light, S01d is performed. In S01d, it is determined that an abnormality exists in the driver chip 100 connected to the first device group O that does not emit light according to the cascaded sequence. The address pin Di and the relay pin Do of the driver chip 100 are needed to be detected to determine whether they are soldered normally. The device group O connected to the driver chip 100 emits light normally after repairing.

In some examples, S01 may be continued to determine whether there is an abnormality exists in remaining driver chips 100, until all the device groups O connected to the driver chips 100 emit light normally.

Based on the embodiments above, S01a may be used to drive the light-emitting substrate 200 to emit light normally.

In some embodiments, the testing method may include S1A and S01. S1A is used to test the device groups O connected to the driver chips 100, and S01 is used to detect the cascaded connection between the plurality of driver chips 100, thereby helping improve the repairing efficiency of the light-emitting substrate 200.

In some examples, S01 may be performed first, and then S1A is performed. Alternatively, for the testing method, SA1 may be performed first, and then S01 is performed. This is not limited in the embodiments of the present disclosure.

Figure 19:
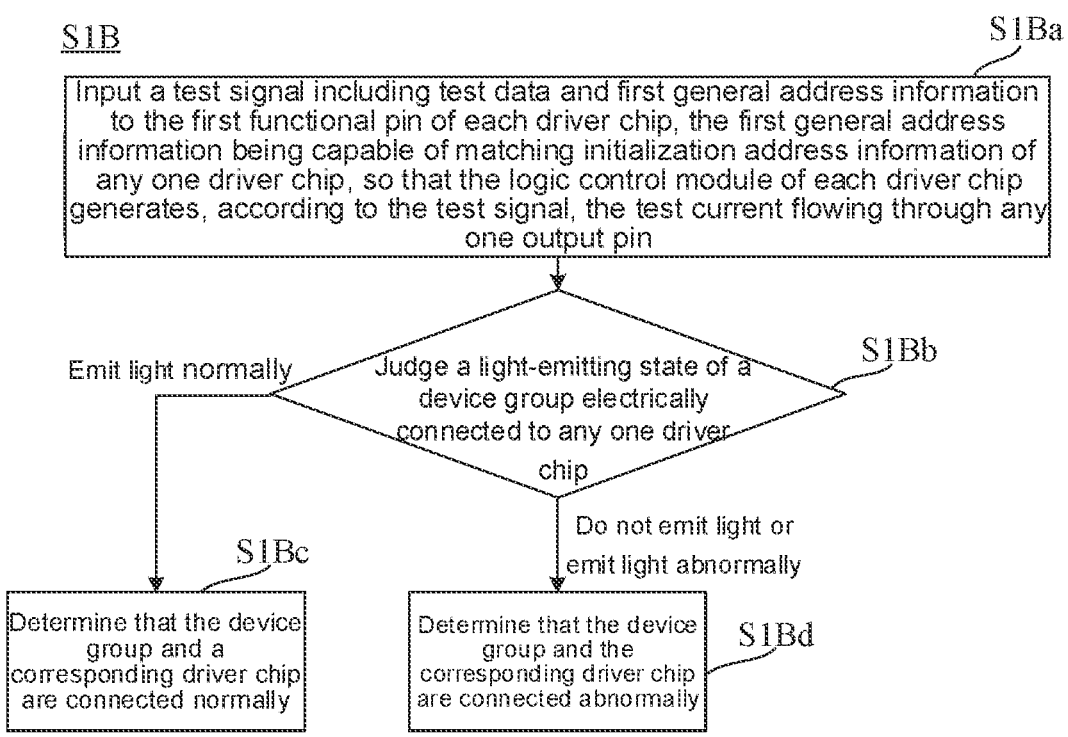
FIG. 19 is a flowchart of a detecting method of a display substrate provided in yet other embodiments of the present disclosure.

FIG. 19 is a flowchart of the detecting method of the light-emitting substrate provided in yet other embodiments of the present disclosure.

In some embodiments, referring to FIG. 19 and in combination with FIG. 12, S1B includes following steps.

In S1Ba, a test signal including test data and first general address information is input to the first functional pin of each driver chip, the first general address information being capable of matching initialization address information of any one driver chip, so that the logic control module of each driver chip generates, according to the test signal, the test current flowing through each output pin.

In S1Bb, the light-emitting state of the device group O electrically connected to any one driver chip 100 is determined.

If the device group O emits light normally, S1Bc is performed. In S1Bc, it is determined that the device group O and the corresponding driver chip 100 are connected normally. If the light-emitting unit E in the device group O emits light normally, the light-emitting unit E and the corresponding driver chip 100 are connected normally. It will be seen that the device group O or the light-emitting unit E does not need to be repaired.

If the device group O does not emit light or emits light abnormally, S1Bd is performed. In S1Bd, it is determined that the device group O and the corresponding driver chip 100 are connected abnormally. If the light-emitting unit E in the device group O does not emit light or emits light abnormally, it is determined that the light-emitting unit E and the corresponding driver chip 100 are connected abnormally.

In the testing method above, the test signal is input to the first functional pin Q1 of each driver chip 100, so that the lighting test for the light-emitting units E electrically connected to the driver chips 100 may be achieved through one detection operation. As a result, it helps improve the repairing efficiency of the driver chips 100.

In the embodiments, the test signal includes the test data and the first general address information, and the first general address information is capable of matching the initialization address information of any one driver chip 100, so that the test current flowing through each output pin OUT is generated. The light-emitting unit E receives the test current to emit light. Since the first general address information is capable of matching the initialization address information of any one driver chip. That is, the test signal may drive all light-emitting units E electrically connected to the driver chips 100 to emit light. If a light-emitting unit E does not emit light, it may be determined that the light-emitting unit E has a problem. Thus, the lighting test for the light-emitting units E electrically connected to the driver chip 100 may be achieved through one detection operation, thereby effectively improving the repairing efficiency of the driver chips 100.

Figure 20:
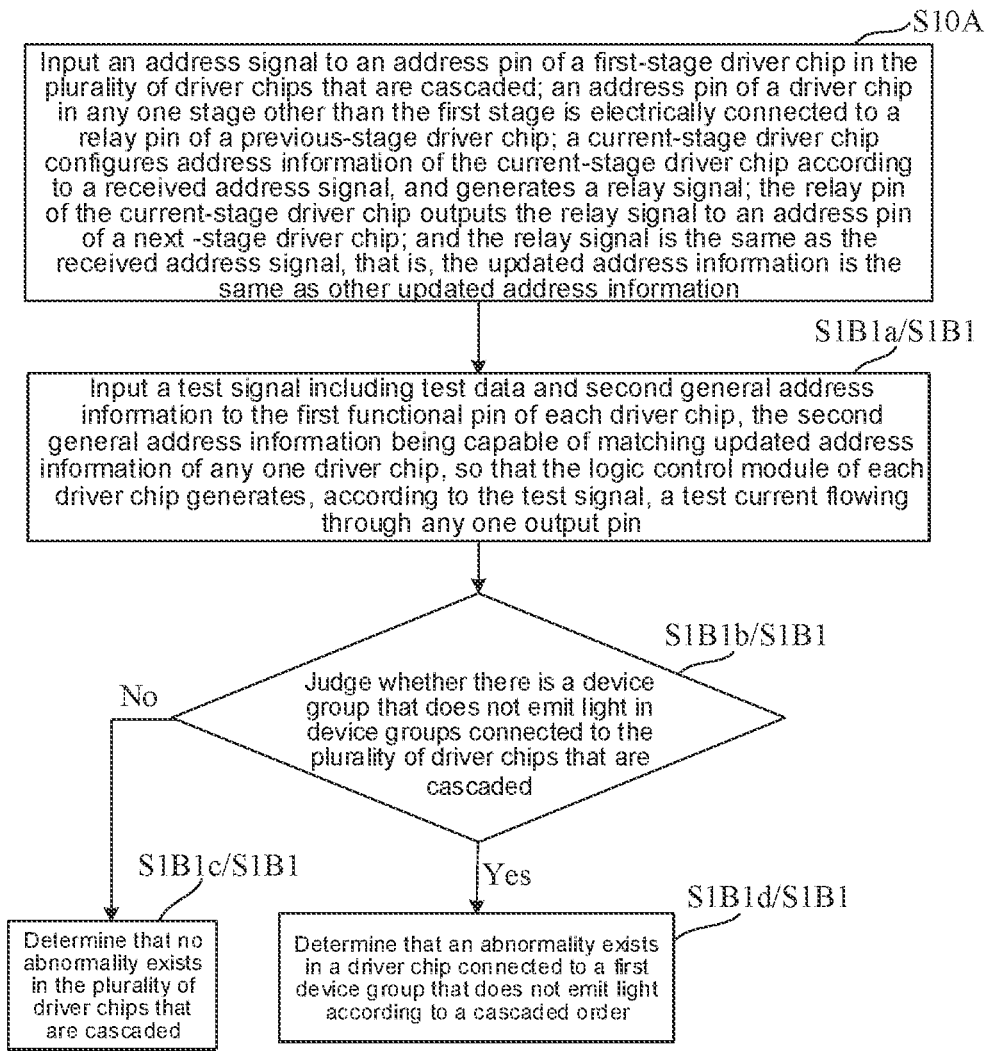
FIG. 20 is a flowchart of a detecting method of a display substrate provided in yet other embodiments of the present disclosure.

FIG. 20 is a flowchart of the detecting method of the light-emitting substrate provided in yet other embodiments of the present disclosure.

In some embodiments, referring to FIG. 20 and in combination with FIG. 12, the testing method further includes following steps.

In S10A, an address signal is input to the address pin of the first-stage driver chip in the plurality of driver chips that are cascaded. The address pin of a driver chip in any one stage other than the first stage is electrically connected to the relay pin of the previous-stage driver chip. A current-stage driver chip configures the address information of the driver chip according to a received address signal, and generates a relay signal; a relay pin of the current-stage driver chip outputs the relay signal to the address pin of the next-stage driver chip. The relay signal and the received address signal are the same. That is, the updated address information (the address information after the initialization information is updated) is the same as other updated address information.

In some examples, the address signal may be a digital signal. After a driver chip 100 receives the address signal, the driver chip 100 may analyze, obtain and store the address information in the address signal, and may further modulate the address signal incremented by 0 (a new address signal) into the relay signal. The relay signal serves as the address signal for the next-stage driver chip 100. The relay signal is made to be the same as the address signal. Of course, the driver chip 100 may also adopt another different function to generate the new address signal.

S1B1 may further be included after S10A. In this case, S1B1 is performed to determine whether there is an abnormality in the plurality of driver chips 100 that are cascaded arranged. S1B1 includes following steps.

In S1B1a, a test signal including test data and second general address information is input to the first functional pin of each driver chip, the second general address information being capable of matching updated address information (the address information after the initialization information is updated) of any one driver chip, so that the logic control module of each driver chip generates, according to the test signal, the test current flowing through each output pin.

In S1B1b, it is determined whether there is a device group that does not emit light in the device groups connected to the plurality of driver chips that are cascaded.

If there is no device group that does not emit light, S1B1c is performed. In S1B1c, it is determined that no abnormality exists in the plurality of driver chips that are cascaded. Thus, address pins Di and relay pins Do of the driver chips 100 connected to the light-emitting units E are soldered normally. It will be seen that the driver chips 100 do not need to be repaired.

If there is the device group that does not emit light, S1B1d is performed. In S1B1d, it is determined that an abnormality exists in the driver chip connected to the first device group that does not emit light according to the cascaded sequence. That is, the address pin Di and the relay pin Do of the driver chip 100 are soldered abnormally. It will be seen that the driver chip 100 needs to be repaired.

Based on this, it may be determined according to whether the driver chips 100 electrically connected to all the light-emitting units E emit light. If starting from a certain driver chip 100, light-emitting units E electrically connected to subsequent driver chips 100 do not emit light, it may be determined that a problem exists in the soldering at the address pin Di and the relay pin Do of the driver chip 100, and repairing is needed.

In some embodiments, the testing method includes S1B, S10A and S1B1. Since each driver chip 100 will be set with the initialization address information when leaving the factory. Firstly, in S1B, the first general address information in the test signal matches the initialization address information in any one driver chip 100, so that the logic control module of each driver chip 100 generates the test current flowing through each output pin OUT; the device group O receives the test current to emit light; and it is determined whether a light-emitting unit E is soldered normally according to whether the light-emitting unit E in the device group O emits light. Then, S10A is performed to update the initial address information, so that updated address information is obtained, and the updated address information is the same as other updated address information. Next, the second general address information (the second general address information being capable of matching the updated address information of any one driver chip) in the test signal is used in the step S1B1, so that the logic control module of each driver chip 100 generates the test current flowing through each output pin OUT; the device group O receives the test current and emits light. If no light is emitted from the beginning of a certain device group O, it will be seen that, initialization address information in a driver chip 100 connected to the device group O that does not emit light is not updated to the address information matching the second general address information. Therefore, the driver chip 100 has abnormality. That is, the address pin Di and the relay pin Do of the driver chip 100 for receiving the updated address information may be soldered abnormally. Coordinates of the abnormal light-emitting unit E in S1B and coordinates of the abnormal driver chip 100 in S1B1 are recorded, and both the abnormal light-emitting unit E and the abnormal driver chip 100 are detected, which helps improve the repairing efficiency of the light-emitting substrate 200.

Figure 21:
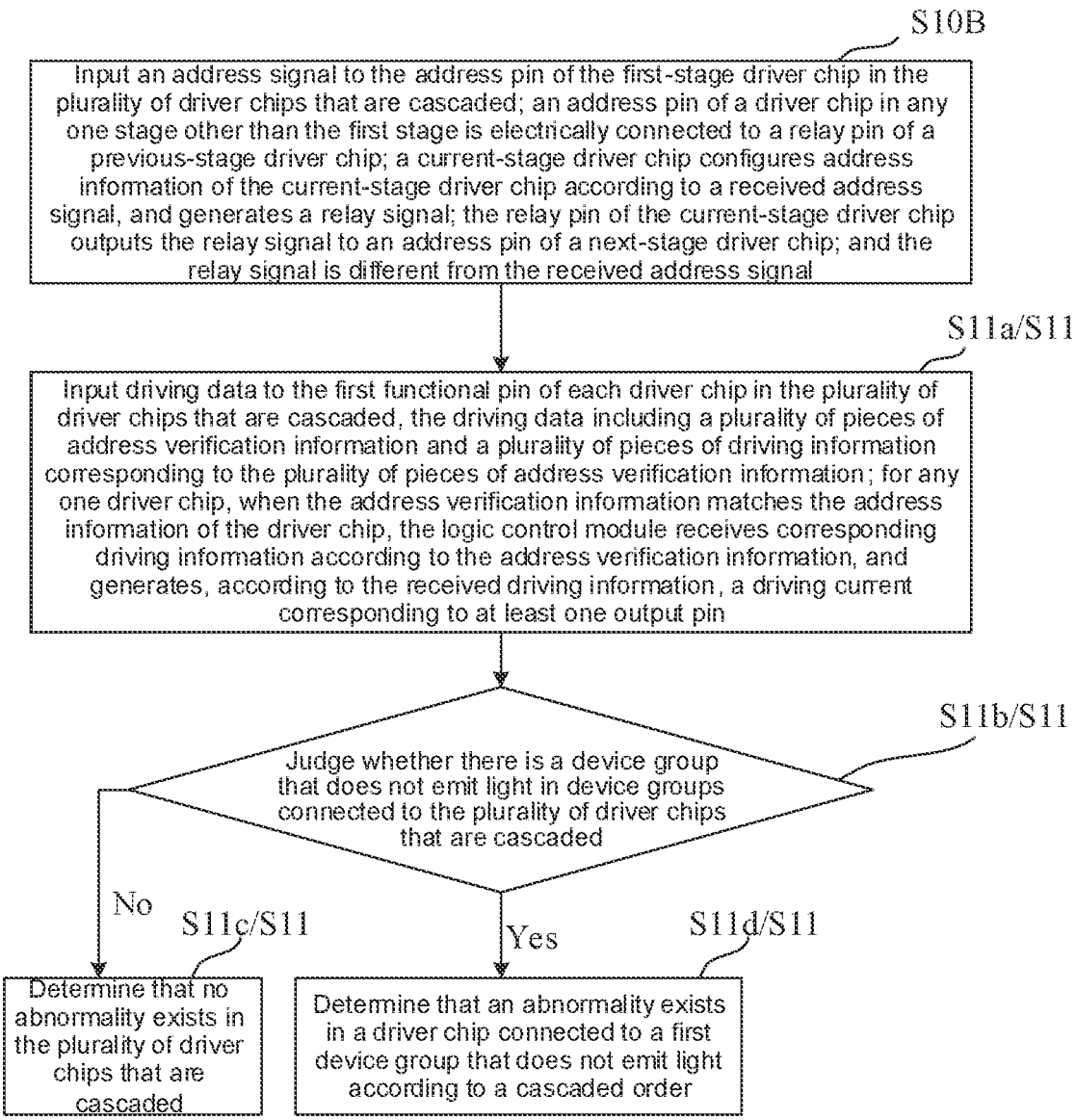
FIG. 21 is a flowchart of a detecting method of a display substrate provided in yet other embodiments of the present disclosure.

FIG. 21 is a flowchart of the detecting method of the light-emitting substrate provided in yet other embodiments of the present disclosure.

In some embodiments, the first functional pin Q1 of the driver chip 100 receives the test signal and the driving data in the time-sharing manner. Referring to FIG. 21 and in combination with FIG. 12, the testing method further includes following steps.

In S10B, an address signal is input to the address pin of the first-stage driver chip in the plurality of driver chips that are cascaded; an address pin of a driver chip in any one stage other than the first stage is electrically connected to a relay pin of a previous-stage driver chip, a current-stage driver chip configures the address information of the current-stage driver chip according to a received address signal, and generates a relay signal; a relay pin of the current-stage driver chip outputs the relay signal to an address pin of a next-stage driver chip. The relay signal is different from the received address signal.

In S10B, the address signal is input to address pins Di of the plurality of driver chips 100 that are cascaded, the current-stage driver chip 100 configures the address information of the driver chip 100 according to the received address signal, and generates the relay signal; the relay pin Do of the current-stage driver chip is capable of outputting the relay signal to the next-stage driver chip 100. An address is written to each driver chip 100 in S01. The relay signal is different from the received address signal.

In some examples, the address signal may be a digital signal. After a driver chip 100 receives the address signal, the driver chip 100 may analyze, obtain and store the address information in the address signal, and may further increase the address signal by 1 or another non-zero fixed amount, and modulate the incremented address signal (a new address signal) into the relay signal; the relay signal serves as an address signal for the next-stage driver chip 100. As a result, the relay signal is different from the received address signal. Of course, the driver chip 100 may also adopt another different function to generate the new address signal.

In S11, driving data is input to the first functional pin of each driver chip in the plurality of driver chips that are cascaded, the driving data includes a plurality of pieces of address verification information and a plurality of pieces of driving information corresponding to the plurality of pieces of address verification information. For any one driver chip, when a piece of address verification information matches the address information of the driver chip, the logic control module receives a corresponding piece of driving information according to the piece of address verification information, and generates, according to the received driving information, a driving current corresponding to at least one output pin. It is determined whether there is a device group that does not emit light in the device groups connected to the plurality of driver chips that are cascaded. If yes, it is determined that an abnormality exists in a driver chip connected to a first device group that does not emit light according to the cascade sequence. If not, it is determined that no abnormality exists in the plurality of driver chips that are cascaded.

As for step S11,
in S11a, the driving data is input to the first functional pin of each driver chip in the plurality of driver chips that are cascaded, the driving data includes the plurality of pieces of address verification information and the plurality of pieces of driving information corresponding to the plurality of pieces of address verification information. For any one driver chip 100, when the piece of address verification information matches the address information of the driver chip 100, the logic control module receives the corresponding piece of driving information according to the piece of address verification information, and generates, according to the received driving information, the driving current corresponding to the at least one output pin OUT.

In S11b, it is determined whether there is a device group O that does not emit light in the device groups O connected to the plurality of driver chips 100 that are cascaded.

If there is no device group that does not emit light, S11c is performed. In S11c, it is determined that no abnormality exists in the plurality of driver chips 100 that are cascaded, and there is no need to repair the driver chips 100.

If there is the device group that does not emit light, S11d is performed. In S11d, it is determined that there is an abnormality in the driver chip 100 connected to the first device group O that does not emit light according to the cascaded sequence. The address pin Di and the relay pin Do of the driver chip 100 are needed to be detected to determine whether they are soldered normally. The device group O connected to the driver chip 100 emits light normally after repairing.

In some examples, S11 may be continued to determine whether there is an abnormality exists in the remaining driver chips 100, until all the device groups O connected to the driver chips 100 emit light normally.

Based on the embodiments above, S10B and S11a may be performed to drive the light-emitting substrate 200 to emit light normally.

In some embodiments, the testing method may include S1B, S10B and S11. S1B is used to test the device groups O connected to the driver chip 100, and S10B and S11 are performed to detect the cascaded connection between the plurality of driver chips 100, thereby further helping improve the repairing efficiency of the light-emitting substrate 200.

In some examples, for the testing method, S1B may be performed first, and then S10B and S11 are performed.

In summary, the embodiments of the present disclosure provide the driver chip 100, the light-emitting substrate 200 and the display apparatus 300, and also provide the detecting method of the light-emitting substrate. A structure of the driver chip 100 is optimized. For example, the driver chip 100 includes the first functional pin Q1 and the second functional pin Q2. The test signal is input to the first functional pin Q1 of each driver chip 100, and the test current flowing through each output pin OUT is generated according to the test signal. The first functional pin Q1 is electrically connected to the second functional pin Q2, and the second functional pin Q2 can output the test signal to the next-stage driver chip 100. The lighting test for the light-emitting units E electrically connected to the driver chips 100 may be achieved through one detection operation. If a light-emitting unit E does not emit light, it may be determined that a problem exists in the light-emitting unit E, which effectively improves the repairing efficiency of the driver chip 100. The light-emitting substrate 200 with the driver chip 100, the display apparatus 300 with the light-emitting substrate 200, and the detecting method of the driver chip 100 all have the beneficial effects of the driver chip 100 in any one of the embodiments above, and will not be repeated here.

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A driver chip, comprising:
   a logic control module;
   at least one output pin electrically connected to the logic control module; and
   a first functional pin electrically connected to the logic control module, wherein the first functional pin is capable of receiving a test signal, and the logic control module is configured to generate, according to the test signal, a test current flowing through each output pin;
   an address pin electrically connected to the logic control module, wherein the address pin is capable of receiving driving data, and the driving data includes address verification information and a plurality of pieces of driving information corresponding to a plurality of driver chips that are cascaded; and the logic control module is further configured to:
      obtain, according to the address verification information, a piece of driving information corresponding to the driver chip;
      update the address verification information; and
      generate driving data including updated address verification information; and
   a relay pin electrically connected to the logic control module, wherein the relay pin is capable of outputting the driving data including the updated address verification information.

2. The driver chip according to claim 1, wherein the test signal includes a switch signal, and the switch signal is used to control the logic control module to generate the test current flowing through each output pin.

3. The driver chip according to claim 1, further comprising:
   a second functional pin and a first connection line, wherein
   the second functional pin is connected to the first functional pin through the first connection line; the second functional pin is capable of outputting the test signal;

the driver chip has a first edge and a second edge that are parallel to each other, and the driver chip further has a third edge located between a first end of the first edge and a first end of the second edge;

one of the first functional pin and the second functional pin is close to the first edge, and another one thereof is close to the second edge;

one of the address pin and the relay pin is close to the first edge, and another one thereof is close to the second edge; and the address pin and the relay pin are both closer to the third edge than the first functional pin and the second functional pin.

4. The driver chip according to claim 3, further comprising:
at least one ground pin electrically connected to the logic control module, wherein a ground pin in the at least one ground pin is capable of receiving a ground signal, and the ground pin is located between the address pin and the relay pin.

5. The driver chip according to claim 3, further comprising:
a first power supply pin electrically connected to the logic control module, wherein the first power supply pin is capable of receiving a power supply signal, and the first power supply pin is close to the first edge or the second edge; or the first power supply pin electrically connected to the logic control module, wherein the first power supply pin is capable of receiving the power supply signal, and the first power supply pin is close to the first edge or the second edge; and a second power supply pin and a second connection line, wherein the second power supply pin is connected to the first power supply pin through the second connection line, and the second power supply pin is capable of outputting the power supply signal; one of the first power supply pin and the second power supply pin is close to the first edge, and another one thereof is close to the second edge; and the first power supply pin and the second power supply pin are both farther away from the third edge than the address pin and the relay pin.

6. The driver chip according to claim 3, wherein
the driver chip further has a fourth edge located between a second end of the first edge and a second end of the second edge; and the at least one output pin includes a plurality of output pins, the plurality of output pins are close to the fourth edge, and the plurality of output pins are arranged along an extending direction of the fourth edge.

7. A light-emitting substrate, comprising:
a plurality of driver chips that are cascaded, each driver chip being the driver chip according to claim 1; and
a plurality of device groups, wherein at least one output pin of the driver chip is electrically connected to at least one first terminal of a device group, respectively.

8. The light-emitting substrate according to claim 7, wherein the driver chip further includes a first power supply pin and at least one ground pin, and the first power supply pin and the at least one ground pin are electrically connected to the logic control module;
a relay pin of a former-stage driver chip in the plurality of driver chips is electrically connected to an address pin of a latter-stage driver chip in the plurality of driver chips; and
the light-emitting substrate further comprises a conductive layer, wherein the conductive layer includes:

a second voltage line electrically connected to second terminals of the device groups;

an address signal line electrically connected to an address pin of a first-stage driver chip in the plurality of driver chips;

a first voltage line electrically connected to a first power supply pin of the first-stage driver chip;

a test signal line electrically connected to a first functional pin of the first-stage driver chip; and a ground line electrically connected to the at least one ground pin of each driver chip;

wherein the second voltage line, the address signal line, the first voltage line, the test signal line and the ground line do not overlap with each other; and the address signal line is configured to transmit an address signal, the test signal line is configured to transmit the test signal and driving data in a time-sharing manner; or the address signal line is configured to transmit the driving data, and the test signal line is configured to transmit the test signal.

9. The light-emitting substrate according to claim 7, wherein the driver chip further includes a second functional pin, a second functional pin of a current-stage driver chip is electrically connected to a first functional pin of the current-stage driver chip and a first functional pin of a next-stage driver chip in the plurality of driver chips; and/or
the driver chip further includes a second power supply pin, and a second power supply pin of the current-stage driver chip is electrically connected to a first power supply pin of the current-stage driver chip and a first power supply pin of the next-stage driver chip in the plurality of driver chips.

10. A display apparatus, comprising the light-emitting substrate according to claim 7.

11. A driver chip, comprising:
a logic control module;
at least one output pin electrically connected to the logic control module; and
a first functional pin electrically connected to the logic control module, wherein the first functional pin is capable of receiving a test signal, and the logic control module is configured to generate, according to the test signal, a test current flowing through each output pin;
an address pin electrically connected to the logic control module, the address pin being capable of receiving an address signal, and the logic control module being further configured to configure address information of the driver chip according to the address signal and generate a relay signal; and
a relay pin electrically connected to the logic control module, the relay pin being capable of outputting the relay signal, wherein
the first functional pin is further capable of receiving driving data, the driving data includes a plurality of pieces of address verification information and a plurality of pieces of driving information corresponding to the plurality of pieces of address verification information; and
the logic control module is further configured to: when a piece of address verification information in the plurality of pieces of address verification information matches the address information of the driver chip, receive a corresponding piece of driving information according to the piece of address verification information, and generate a driving current corresponding to the at least one output pin according to the received driving information.

12. The driver chip according to claim 11, wherein
the test signal includes test data and general address information, the general address information is capable of matching address information of any one driver chip, and the logic control module is configured to generate, according to the test data, the test current flowing through each output pin.

13. The driver chip according to claim 11, further comprising:
a second functional pin and a first connection line, wherein
the second functional pin is connected to the first functional pin through the first connection line; the second functional pin is capable of outputting the test signal;
the driver chip has a first edge and a second edge that are parallel to each other, and the driver chip further has a third edge located between a first end of the first edge and a first end of the second edge;
one of the first functional pin and the second functional pin is close to the first edge, and another one thereof is close to the second edge;
one of the address pin and the relay pin is close to the first edge, and another one thereof is close to the second edge; and
the address pin and the relay pin are both closer to the third edge than the first functional pin and the second functional pin.

14. A light-emitting substrate, comprising:
a plurality of driver chips that are cascaded, each driver chip being the driver chip according to claim 11; and
a plurality of device groups, wherein at least one output pin of the driver chip is electrically connected to at least one first terminal of a device group, respectively.

15. A testing method of a light-emitting substrate, wherein the light-emitting substrate comprises a plurality of driver chips that are cascaded and a plurality of device groups, each driver chip includes a logic control module, at least one output pin electrically connected to the logic control module, and a first functional pin electrically connected to the logic control module, the first functional pin is capable of receiving a test signal, the logic control module is configured to generate, according to the test signal, a test current flowing through each output pin, and at least one output pin of the driver chip is electrically connected to at least one first terminal of a device group, respectively;
the testing method comprises:
inputting a test signal to a first functional pin of each driver chip, so that a logic control module of each driver chip generates, according to the test signal, a test current flowing through each output pin of the driver chip;
determining a light-emitting state of a device group electrically connected to any one driver chip;
if the device group emits light normally, determining that the device group and a corresponding driver chip are connected normally; and
if the device group does not emit light or emits light abnormally, determining that the device group and the corresponding driver chip are connected abnormally.

16. The testing method according to claim 15, wherein inputting the test signal to the first functional pin of each driver chip includes:
inputting a switch signal to the first functional pin of each driver chip, the switch signal being used to control the logic control module to generate the test current flowing through each output pin.

17. The testing method according to claim 15, further comprising:
inputting driving data to an address pin of a first-stage driver chip in the plurality of driver chips that are cascaded, the driving data including address verification information and a plurality of pieces of driving information corresponding to the plurality of driver chips that are cascaded, wherein an address pin of a driver chip in any one stage other than the first stage is electrically connected to a relay pin of a previous-stage driver chip; a current-stage driver chip obtains, according to the address verification information, a piece of driving information corresponding to the current-stage driver chip, and generates, according to the piece of driving information, a driving current corresponding to the device group connected to the current-stage driver chip; the current-stage driver chip further updates the address verification information, generates driving data including the updated address verification information, and outputs the driving data including the updated address verification information to an address pin of a next-stage driver chip through a relay pin of the current-stage driver chip;
determining whether there is a device group that does not emit light in device groups connected to the plurality of driver chips that are cascaded;
if there is the device group that does not emit light, determining that an abnormality exists in a driver chip connected to a first device group that does not emit light according to a cascaded sequence; and
if there is no device group that does not emit light, determining that no abnormality exists in the plurality of driver chips that are cascaded.

18. The testing method according to claim 15, wherein inputting the test signal to the first functional pin of each driver chip includes:
inputting a test signal including test data and first general address information to the first functional pin of each driver chip, the first general address information being capable of matching initialization address information of any one driver chip.

19. The testing method according to claim 18, further comprising:
inputting an address signal to an address pin of a first-stage driver chip in the plurality of driver chips that are cascaded, wherein an address pin of a driver chip in any one stage other than the first stage is electrically connected to a relay pin of a previous-stage driver chip; a current-stage driver chip configures address information of the current-stage driver chip according to a received address signal, and generates a relay signal; a relay pin of the current-stage driver chip outputs the relay signal to an address pin of a next-stage driver chip; and the relay signal and the received address signal are same;
inputting a test signal including test data and second general address information to the first functional pin of each driver chip, the second general address information being capable of matching updated address information of any one driver chip, so that the logic control module of each driver chip generates, according to the test signal, a test current flowing through each output pin; and
determining whether there is a device group that does not emit light in device groups connected to the plurality of driver chips that are cascaded;

if there is the device group that does not emit light, determining that an abnormality exists in a driver chip connected to a first device group that does not emit light according to a cascaded sequence; and if there is no device group that does not emit light, determining that no abnormality exists in the plurality of driver chips that are cascaded.

20. The testing method according to claim 18, further comprising:

inputting an address signal to an address pin of a first-stage driver chip in the plurality of driver chips that are cascaded, wherein an address pin of a driver chip in any one stage other than the first stage is electrically connected to a relay pin of a previous-stage driver chip; a current-stage driver chip configures address information of the current-stage driver chip according to a received address signal, and generates a relay signal; a relay pin of the current-stage driver chip outputs the relay signal to an address pin of a next-stage driver chip; and the relay signal is different from the received address signal;

inputting driving data to the first functional pin of each driver chip in the plurality of driver chips that are cascaded, the driving data including a plurality of pieces of address verification information and a plurality of pieces of driving information corresponding to the plurality of pieces of address verification information, wherein for any one driver chip, when a piece of address verification information in the plurality of pieces of address verification information matches the address information of the driver chip, a logic control module receives a corresponding piece of driving information according to the piece of address verification information, and generates, according to the received driving information, a driving current corresponding to at least one output pin; and determining whether there is a device group that does not emit light in device groups connected to the plurality of driver chips that are cascaded;

if there is the device group that does not emit light, determining that an abnormality exists in a driver chip connected to a first device group that does not emit light according to a cascaded sequence; and if there is no device group that does not emit light, determining that no abnormality exists in the plurality of driver chips that are cascaded.

\* \* \* \* \*

UNITED STATES PATENT AND TRADEMARK OFFICE
CERTIFICATE OF CORRECTION

| | | |
|---|---|---|
| PATENT NO. | : 12,347,352 B2 | Page 1 of 1 |
| APPLICATION NO. | : 18/263378 | |
| DATED | : July 1, 2025 | |
| INVENTOR(S) | : Wei Hao et al. | |

It is certified that error appears in the above-identified patent and that said Letters Patent is hereby corrected as shown below:

On the Title Page

Item (73):
Correct 2nd named Assignee from ROE TECHNOLOGY GROUP CO., LTD to BOE TECHNOLOGY GROUP CO.,LTD.

Signed and Sealed this
Ninth Day of September, 2025

Coke Morgan Stewart
*Acting Director of the United States Patent and Trademark Office*